US012677438B2

(12) United States Patent
Zhang et al.

(10) Patent No.: US 12,677,438 B2
(45) Date of Patent: Jul. 7, 2026

(54) VTFET WITH BURIED POWER RAILS

(71) Applicant: INTERNATIONAL BUSINESS MACHINES CORPORATION, Armonk, NY (US)

(72) Inventors: Chen Zhang, Santa Clara, CA (US); Ruilong Xie, Niskayuna, NY (US); Heng Wu, Santa Clara, CA (US); Junli Wang, Slingerlands, NY (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 474 days.

(21) Appl. No.: 18/232,510

(22) Filed: Aug. 10, 2023

(65) Prior Publication Data

US 2023/0387295 A1     Nov. 30, 2023

Related U.S. Application Data

(62) Division of application No. 17/477,532, filed on Sep. 17, 2021, now Pat. No. 11,764,298.

(51) Int. Cl.
H01L 29/78 (2006.01)
H01L 21/762 (2006.01)
(Continued)

(52) U.S. Cl.
CPC ........... H10D 30/63 (2025.01); H10D 30/025 (2025.01); H10D 64/258 (2025.01);
(Continued)

(58) Field of Classification Search
CPC ........... H01L 23/5286; H01L 21/76898; H01L 21/743; H01L 23/535; H10D 30/025;
(Continued)

(56) References Cited

U.S. PATENT DOCUMENTS 9,165,158 B2    10/2015  Li et al.
9,570,395 B1     2/2017  Sengupta et al.
(Continued)

OTHER PUBLICATIONS

Mell, Peter, et al., "The NIST Definition of Cloud Computing," Recommendations of the National Institute of Standards and Technology, U.S. Department of Commerce, Special Publication 800-145, Sep. 2011, 7 pages.
(Continued)

*Primary Examiner* — John A Bodnar
(74) *Attorney, Agent, or Firm* — Jeffrey M. Ingalls

(57) ABSTRACT

A semiconductor device is provided. The semiconductor device includes a buried power rail, a buried oxide (BOX) layer formed on the buried power rail, a plurality of channel fins formed on the BOX layer, a bottom epitaxial layer formed on the BOX layer and between the channel fins such that the BOX layer is between the buried power rail and the bottom epitaxial layer, a gate stack formed over the bottom epitaxial layer and contacting the channel fins, the gate stack including a work function metal (WFM) layer and a high-x layer, and a top epitaxial layer formed on the gate stack. In the semiconductor device, between two adjacent ones of the channel fins the BOX layer has an opening so that the bottom epitaxial layer is electrically connected to the buried power rail.

10 Claims, 30 Drawing Sheets

(51) Int. Cl.

| | |
|---|---|
| *H01L 21/84* | (2006.01) |
| *H01L 23/528* | (2006.01) |
| *H01L 27/12* | (2006.01) |
| *H01L 29/417* | (2006.01) |
| *H01L 29/51* | (2006.01) |
| *H01L 29/66* | (2006.01) |
| *H10D 30/01* | (2025.01) |
| *H10D 30/63* | (2025.01) |
| *H10D 64/23* | (2025.01) |
| *H10D 64/68* | (2025.01) |
| *H10D 86/00* | (2025.01) |
| *H10D 86/01* | (2025.01) |
| *H10W 10/00* | (2026.01) |
| *H10W 10/17* | (2026.01) |
| *H10W 20/41* | (2026.01) |

(52) U.S. Cl.
CPC ........... *H10D 64/691* (2025.01); *H10D 86/01* (2025.01); *H10D 86/201* (2025.01); *H10W 10/014* (2026.01); *H10W 10/17* (2026.01); *H10W 20/427* (2026.01)

(58) Field of Classification Search
CPC .... H10D 30/63; H10D 86/201; H10D 86/215; H10W 20/481
See application file for complete search history.

(56) References Cited

U.S. PATENT DOCUMENTS

| | | |
|---|---|---|
| 10,127,402 B2 | 11/2018 | Resch |
| 10,586,765 B2 | 3/2020 | Smith et al. |
| 10,985,064 B2 | 4/2021 | Zhang et al. |
| 11,764,298 B2 | 9/2023 | Zhang et al. |

| | | | |
|---|---|---|---|
| 2019/0280120 A1* | 9/2019 | Ok | H10D 64/252 |
| 2020/0075574 A1 | 3/2020 | Smith et al. | |
| 2020/0134128 A1 | 4/2020 | Peng et al. | |
| 2020/0135578 A1 | 4/2020 | Ching et al. | |
| 2020/0203276 A1 | 6/2020 | Hiblot et al. | |
| 2020/0356717 A1 | 11/2020 | Do et al. | |
| 2020/0381300 A1 | 12/2020 | Zhang et al. | |
| 2021/0104550 A1 | 4/2021 | Do | |
| 2022/0013467 A1 | 1/2022 | Lee et al. | |

OTHER PUBLICATIONS

Liang, Wei, et al., "RESH: A Secure Authentication Algorithm Based on Regeneration Encoding Self-Healing Technology in WSN," Journal of Sensors, v. 2016, Article ID 2098680, 11 pages, Hindawi Publishing Corporation, 2016, http://dx.doi.org/10.1155/2016/2098680.

Yan, Meng, et al., "Gecko: A Resilient Dispersal Scheme for Multi-Cloud Storage," IEEE Access, v.7, 2019, 11 pages, Digital Object Identifier 10.1109/ACCESS.2019.2920405.

"Shamir's Secret Sharing," Wikipedia, Printed Jun. 30, 2020, 7 pages, https://en.wikipedia.org/wiki/Shamir's_Secret_Sharing.

"Method for Providing Buried Contact in Vertical Tunnel Field Effect Transistor (VTFET) for Scaling Down Power Rail," IP.Com, An IP.com Prior Art Database Technical Disclosure, IP.com No. IPCOM00025919D, Publication Date Jul. 18, 2019, 4 pages.

"Method and Structure for Implementing Replacement/Buried Power Rail in VTFET," IP.Com, An IP.com Prior Art Database Technical Disclosure, IP.com No. IPCOM000260354D, Publication Date Nov. 14, 2019, 6 pages.

Zhang et al., "VTFET With Buried Power Rails," U.S. Appl. No. 17/477,352, filed Sep. 17, 2021.

List of IBM Patents or Patent Applications Treated as Related, Dated Aug. 9, 2023, 2 pages.

* cited by examiner

100

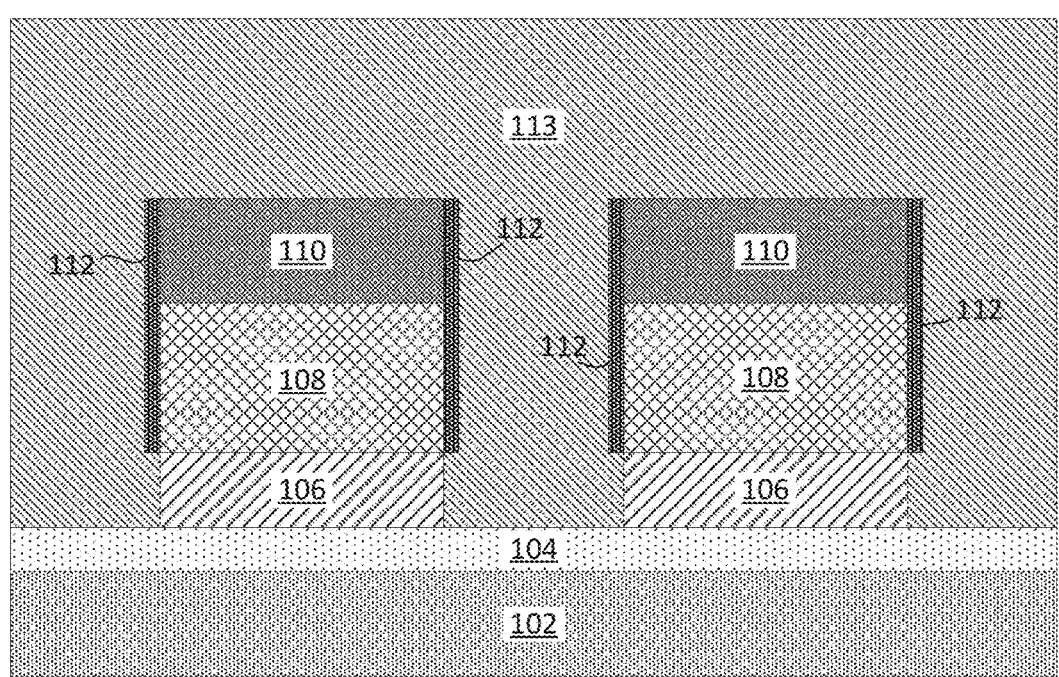
FIG. 5A
FIG. 5B

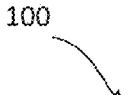
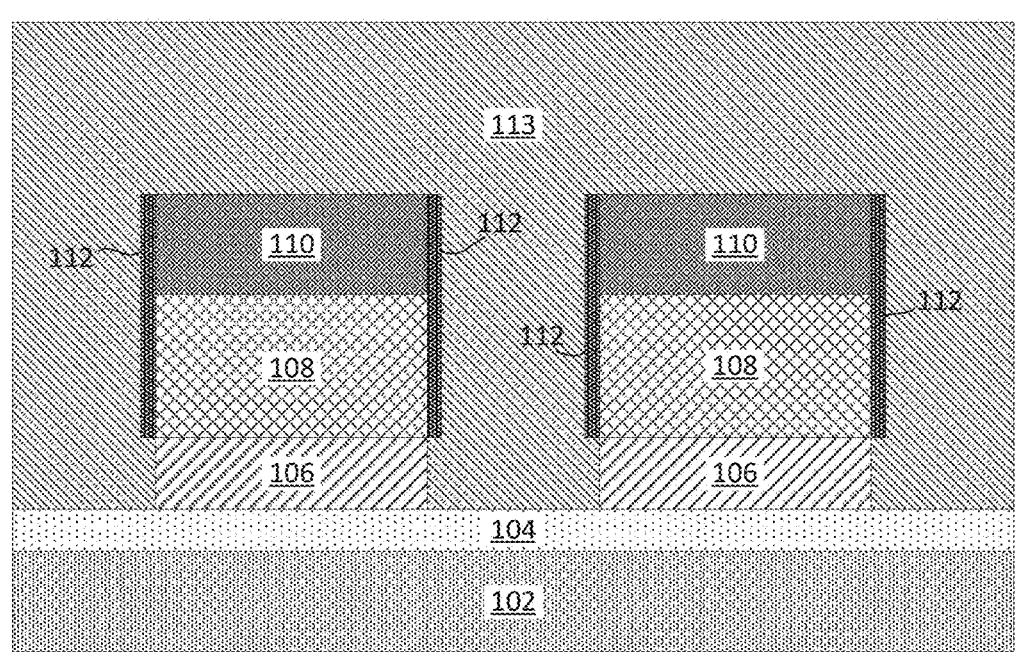
FIG. 6A
FIG. 6B

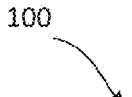
100
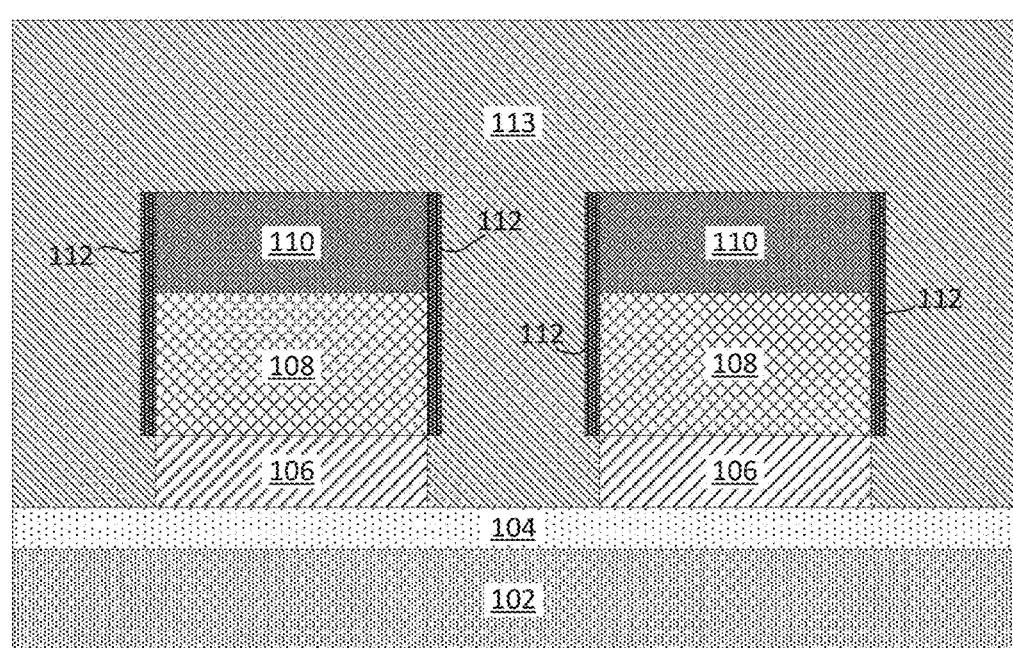
113
112      110      112
112
108
106      104      102
110
112
108
106
FIG. 7A
100
B
PFET
104   112
113
FIG. 7B
NFET   A
104   112
A'
B'

100

100

PFET

NFET

B 102　112

113

102　112

A　A'

B'

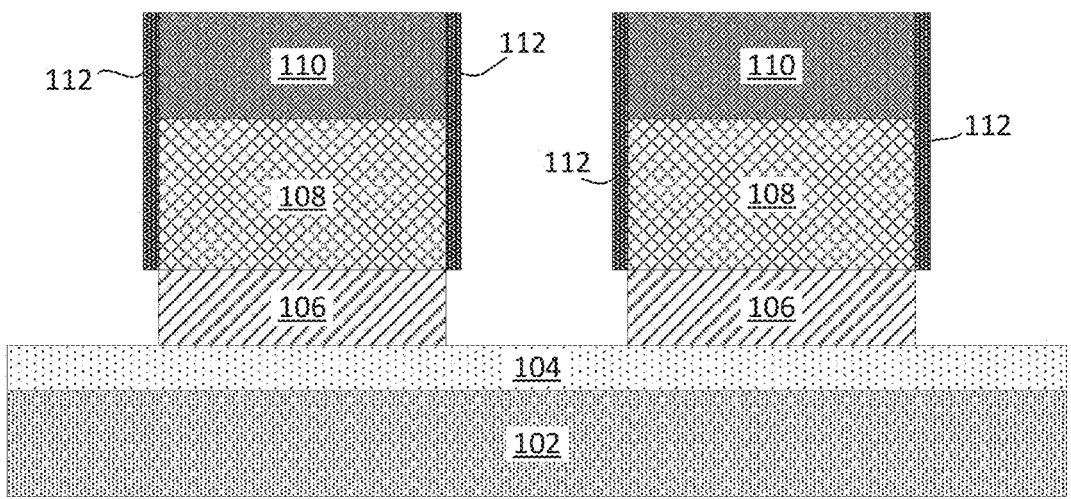
FIG. 9A
FIG. 9B

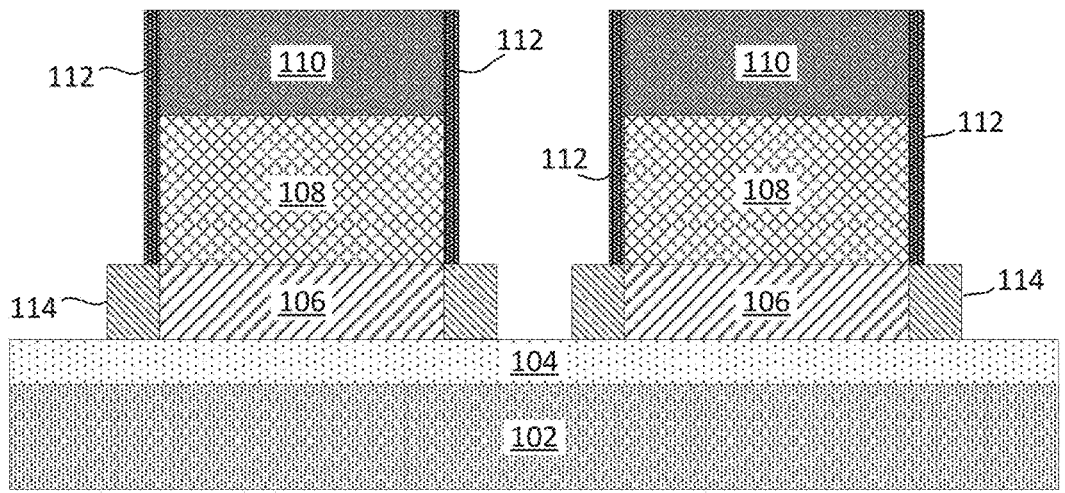
FIG. 10A
FIG. 10B

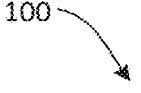
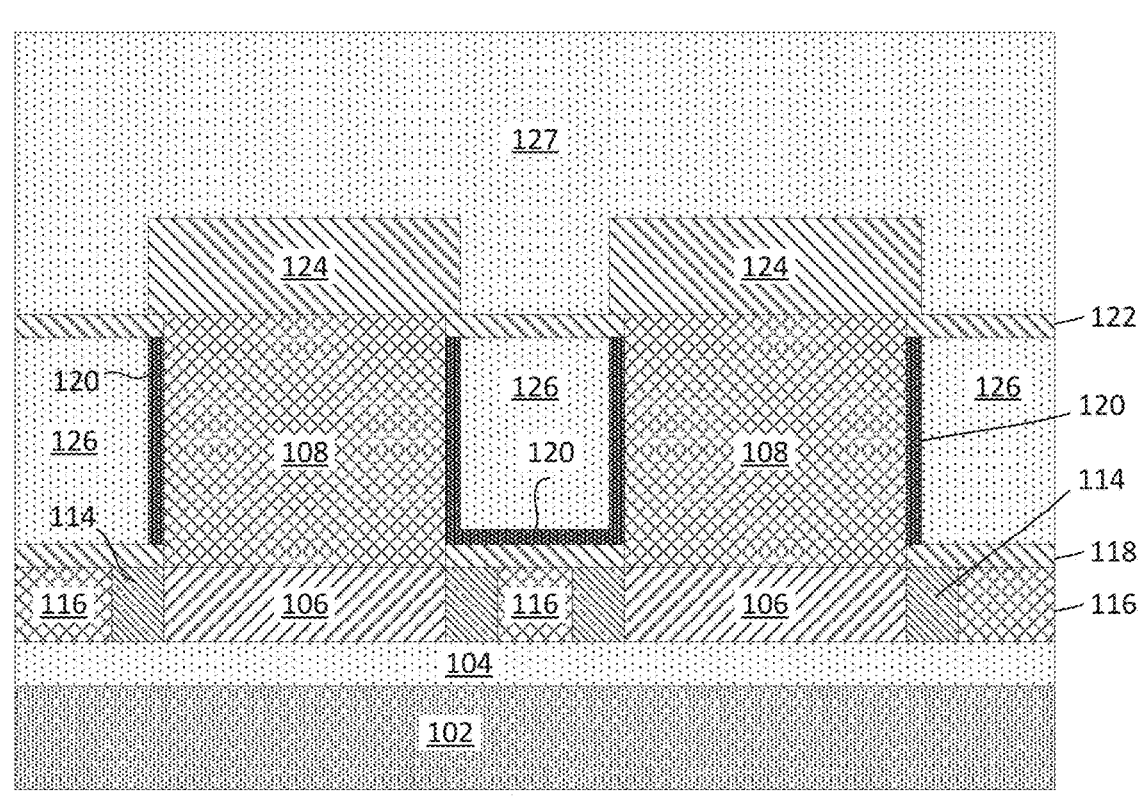
FIG. 12A
FIG. 12B

VTFET WITH BURIED POWER RAILS

BACKGROUND

The present disclosure relates to semiconductor devices. In particular, the present disclosure relates to fabrication methods and resulting gate patterning structures for vertical transport field-effect transistors (VFFETs).

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts.

VTFETs are becoming viable device options for smaller scale semiconductor devices, such as, for example, devices beyond the 7 nanometer (nm) node. VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region.

Vertical transport architecture devices are designed to address the limitations of horizontal device architectures by, for example, decoupling gate length from the contact gate pitch, providing a FinFET-equivalent density at a larger contacted poly pitch (CPP), and providing lower MOL resistance.

VTFET devices provides viable solutions for transistor scaling. With current flowing in the vertical direction, the gate length and source/drain dimension are not limited by the lateral scaling.

Buried power rails (BPRs) may be a component of certain VTFET devices that supply power to the devices from the back side of the wafer. BPRs are important performance and area scaling elements in VTFET technology.

SUMMARY

Embodiments of the present disclosure relate to a semiconductor device. The semiconductor device includes a buried power rail, a buried oxide (BOX) layer formed on the buried power rail, a plurality of channel fins formed on the BOX layer, a bottom epitaxial layer formed on the BOX layer and between the channel fins such that the BOX layer is between the buried power rail and the bottom epitaxial layer, a gate stack formed over the bottom epitaxial layer and contacting the channel fins, the gate stack including a work function metal (WFM) layer and a high-x layer, and a top epitaxial layer formed on the gate stack. In the semiconductor device, between two adjacent ones of the channel fins the BOX layer has an opening so that the bottom epitaxial layer is electrically connected to the buried power rail.

Other embodiments relate to a method for forming the semiconductor device.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

FIG. 5A is a cross-sectional view of the VTFET semiconductor device of FIG. 4A after additional manufacturing operations and taken along the line B-B' of FIG. 5B, according to embodiments.

FIG. 5B is a top down view of the VTFET semiconductor device of FIG. 5A, according to embodiments.

FIG. 6A is a cross-sectional view of the VTFET semiconductor device of FIG. 5A after additional manufacturing operations and taken along the line B-B' of FIG. 6B, according to embodiments.

FIG. 6B is a top down view of the VTFET semiconductor device of FIG. 6A, according to embodiments.

FIG. 7A is a cross-sectional view of the VTFET semiconductor device of FIG. 6A after additional manufacturing operations and taken along the line B-B' of FIG. 7B, according to embodiments.

FIG. 7B is a top down view of the VTFET semiconductor device of FIG. 7A, according to embodiments.

FIG. 9A is a cross-sectional view of the VTFET semiconductor device of FIG. 8A after additional manufacturing operations and taken along the line B-B' of FIG. 9B, according to embodiments.

FIG. 9B is a top down view of the VTFET semiconductor device of FIG. 9A, according to embodiments.

FIG. 10A is a cross-sectional view of the VTFET semiconductor device of FIG. 9A after additional manufacturing operations and taken along the line B-B' of FIG. 10B, according to embodiments.

FIG. 10B is a top down view of the VTFET semiconductor device of FIG. 10A, according to embodiments.

FIG. 12A is a cross-sectional view of the VTFET semiconductor device of FIG. 11A after additional manufacturing operations and taken along the line B-B' of FIG. 12B, according to embodiments.

FIG. 12B is a top down view of the VTFET semiconductor device of FIG. 12A, according to embodiments.

DETAILED DESCRIPTION

Figure 1A:
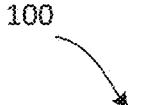
FIG. 1A is a cross-sectional view of a VTFET semiconductor device at an intermediate stage of the manufacturing process and taken along the line B-B' of FIG. 1B, according to embodiments.
Figure 1A:
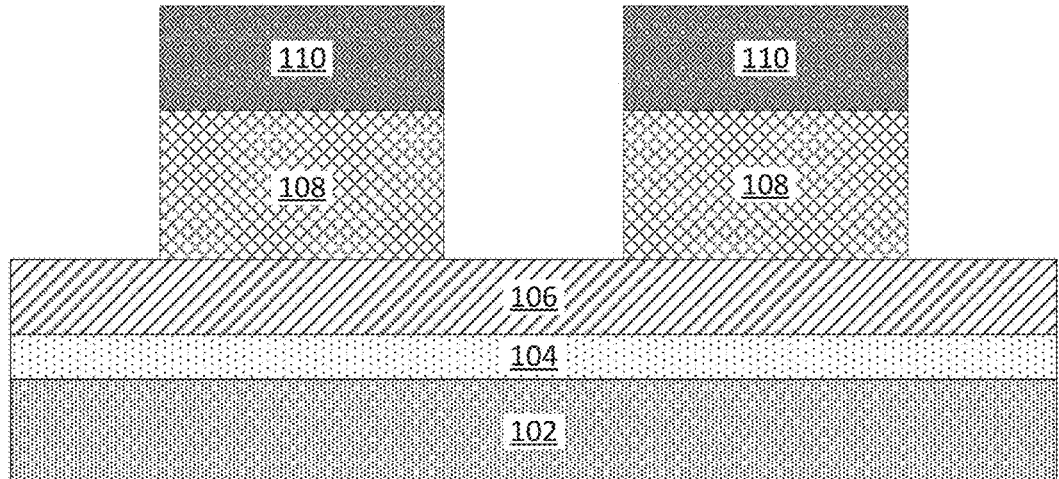

The present disclosure relates to fabrication methods and resulting structures for semiconductor devices, and in particular VTFET devices. Exemplary embodiments will now be discussed in further detail with regard to semiconductor devices and methods of manufacturing same and, in particular, to VTFET devices including buried power rails (BPRs), the formation of which may be assisted by bottom epitaxial growth.

It is to be understood that the various layers and/or regions shown in the accompanying drawings are not drawn to scale, and that one or more layers and/or regions of a type commonly used in, for example, FinFET, VTFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present embodiments can be employed in applications, hardware, and/or electronic systems. Suitable hardware and systems for implementing embodiments may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments. Given the teachings of the embodiments provided herein, one of ordinary skill in the art will be able to contemplate other implementations and applications of the embodiments.

The present embodiments may be used in connection with semiconductor devices that may require, for example, FinFETs, VTFETs, CMOSs, FETs, nanowire FETs, nanosheet FETs, SETs, and/or MOSFETs. By way of non-limiting example, the semiconductor devices can include, but are not necessarily limited to FinFET, VTFET, CMOS, FET, nanowire FET, nanosheet FET, SET, CMOS and MOSFET devices, and/or semiconductor devices that use FinFET, VTFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit ("IC") fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping, and patterning/lithography.

Deposition is any process that grows, coats, or otherwise transfers a material onto the wafer. Available technologies include physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma-enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etching processes (either wet or dry), chemical-mechanical planarization ("CMP"), and the like. One example of a removal process is ion beam etching ("IBE"). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching ("RIE"). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light-sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, in certain VTFET devices, a buried power rail (BPR) is provided to supply power to the VTFET devices from the back side of the wafer. More specifically, the present disclosure relates to fabrication methods and resulting structures for enabling backside power distribution network (BSPDN) integration with a buried power rail (BPR) landing that is assisted by bottom epitaxial growth.

In certain semiconductor devices, buried power rails may be utilized. In general, buried power rails (BPRs) are power rails that are formed below a back-end-of-line (BEOL) metal stack, often times in-level with the transistor fins or even below the transistor fins. Back side (or below the transistor substrate) power delivery systems may help enable technology scaling beyond the 5 nm technology node. The BPR technology also may free up resources for dense logic connections that limit modern processor performance, thus enable further scaling of a standard logic cell. For example, by making the necessary connections to the BPR from the back side of the wafer, this may free up space for making connections on the front side of the wafer (e.g., middle of the line (MOL) and front end of line (FEOL)). The present disclosure provides methods of forming buried power rails (BPRs) and the connection between the bottom S/D and the power rails by selected bottom epitaxial growth. In certain embodiments, the center epitaxial layer in a two fin device connects to the power rail through a dielectric layer, but outer epitaxial structures are not connected. For a three fin device, the center two epitaxial structures are connected, but the outers are not.

Figure 1B:
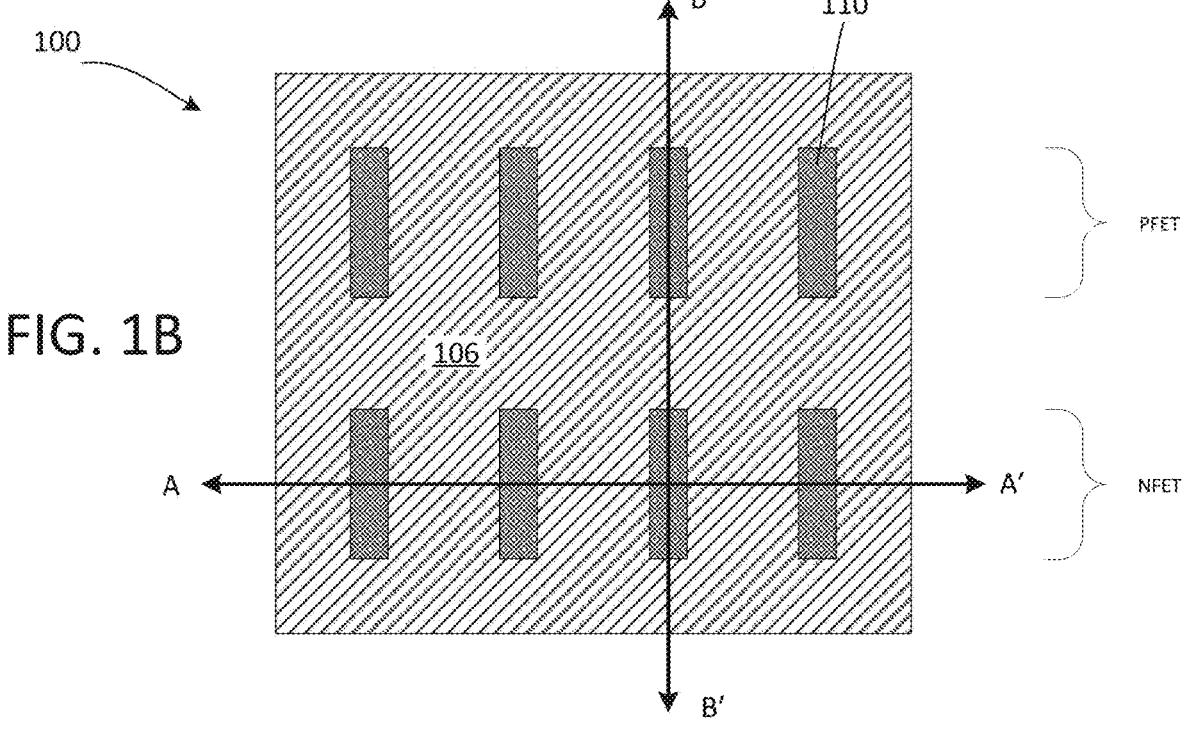
FIG. 1B is a top down view of the VTFET semiconductor device of FIG. 1A, according to embodiments.
Figure 1C:
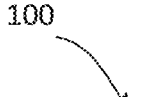
FIG. 1C is a cross-sectional view of the VTFET semiconductor device of FIG. 1A taken along the line A-A' of FIG. 1B, according to embodiments.
Figure 1C:
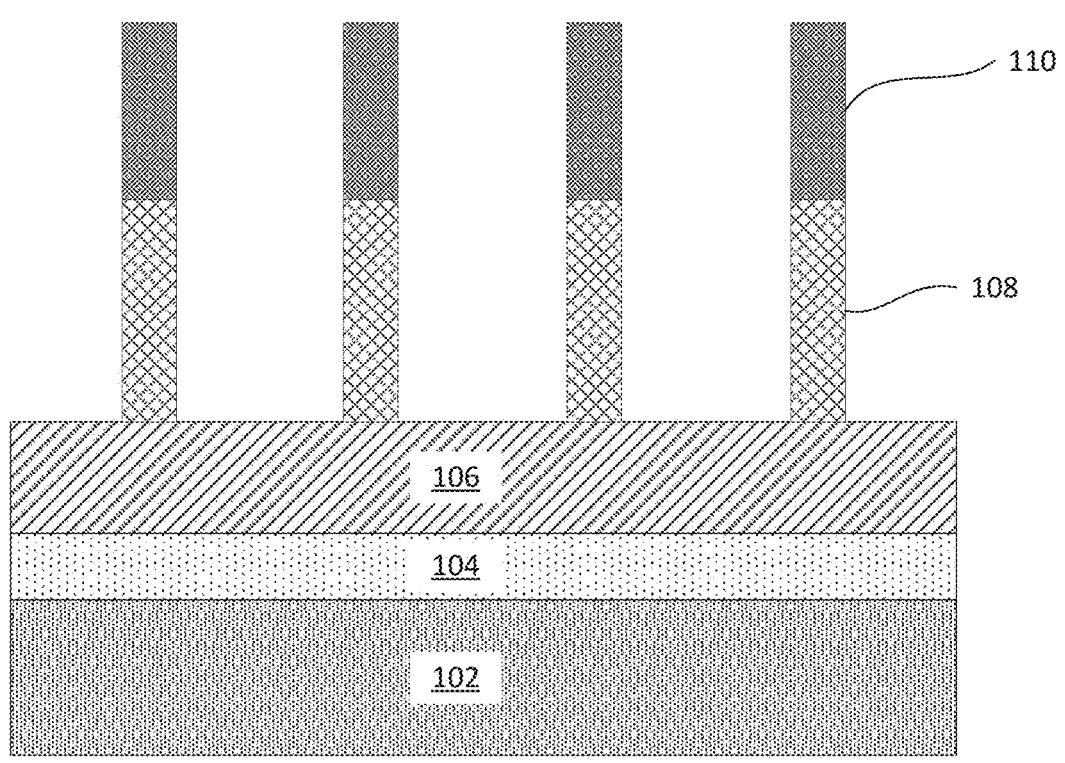

Referring now to the drawings in which like numerals represent the same or similar elements and initially to FIG. 1A, an exemplary method of manufacturing a semiconductor device 100 that is a VTFET device at an intermediate stage of the fabrication process is shown, according to embodiments. As shown in FIG. 1A, which is taken along the line B-B' of FIG. 1B, a substrate 102 is provided. The substrate 102 may include a semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or another like semiconductor. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide (BOX) layer 104, nitride layer or aluminum oxide. As shown in FIGS. 1A and 1C, another semiconductor layer 106 (or a continuation of the substrate 102) is provided above the buried oxide (BOX) layer 104.

As shown in FIGS. 1A and 1C, after depositing a hardmask material or fin hardmask 110 over the substrate 102, fins 108 are patterned. The fin 108 patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. Alternatively, fin 108 patterning can be done by any other suitable patterning technique, including but not limited to, lithography (e.g., extreme ultraviolet (EUV)) in conjunction with ME, self-aligned double patterning (SADP), self-aligned multiple patterning (SAMP), and/or self-aligned quadruple patterning (SAQP)). While embodiments describe channel regions as fins, the embodiments are not necessarily limited to fin channel regions, and may include nanowire channel regions. In addition, although eight fins 108 are shown in the figures for ease of explanation, more or less than eight fins can be formed. As shown in FIG. 1B, the semiconductor device 100 includes a pFET area corresponding to the top four fins 110 and an nFET area corresponding to the bottom four fins 110. It should be appreciated that although the substrate 102, the semiconductor layer 106 and the fins 108 are shown in the figures as different layers, they may be formed as a single layer and made of the same material(s).

Figure 2A:
FIG. 2A is a cross-sectional view of the VTFET semiconductor device of FIG. 1A after additional manufacturing operations and taken along the line B-B' of FIG. 2B, according to embodiments.
Figure 2A:
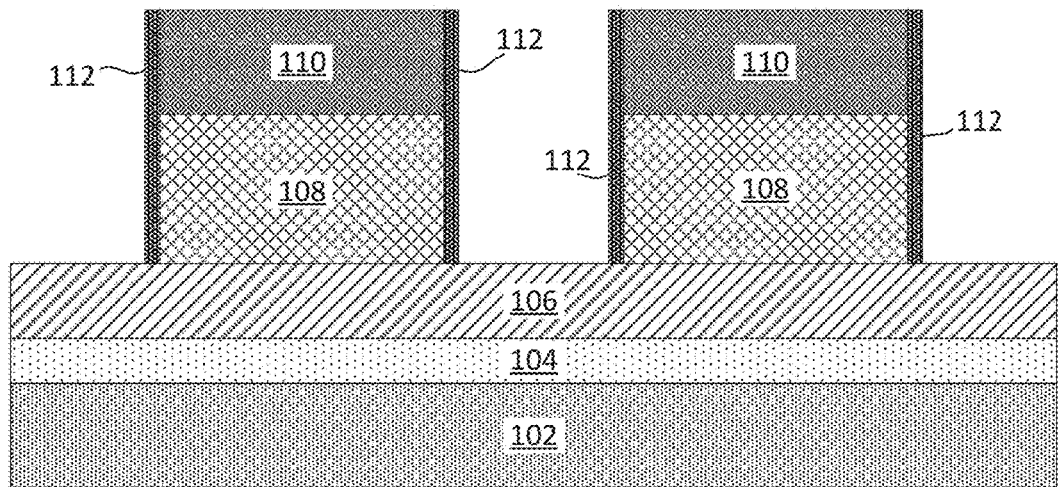
Figure 2B:
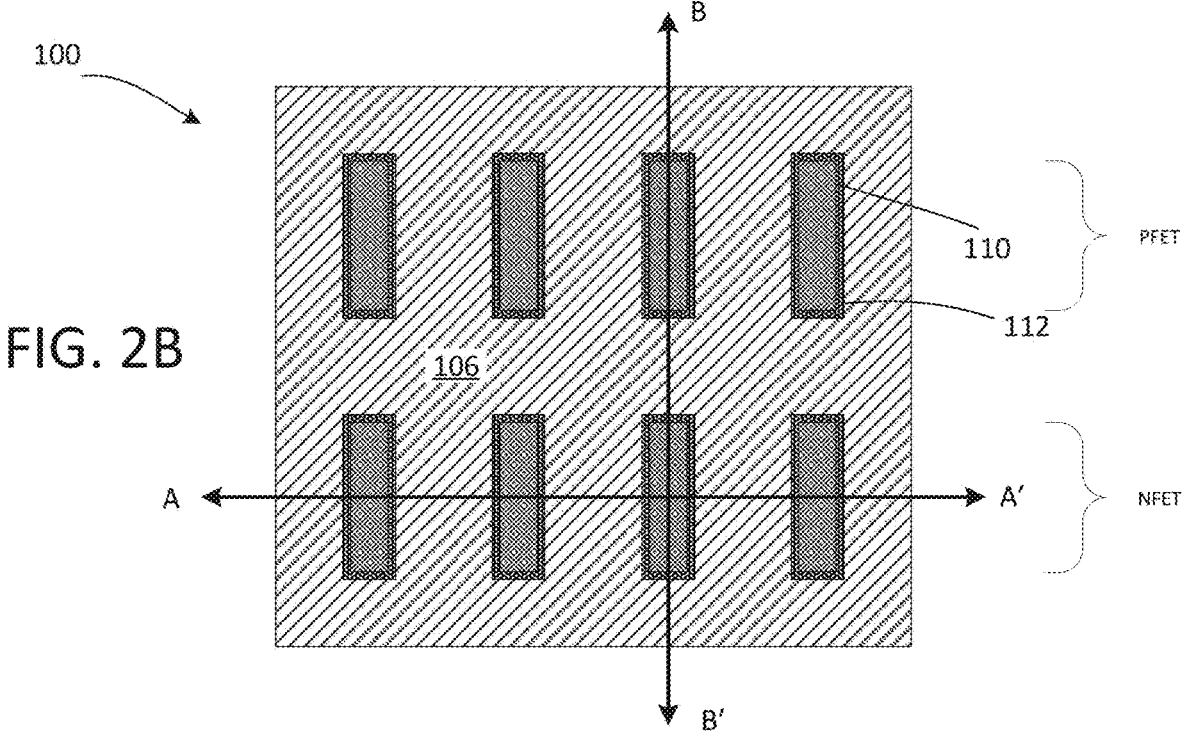
FIG. 2B is a top down view of the VTFET semiconductor device of FIG. 2A, according to embodiments.
Figure 2C:
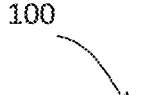
FIG. 2C is a cross-sectional view of the VTFET semiconductor device of FIG. 2A taken along the line A-A' of FIG. 2B, according to embodiments.
Figure 2C:
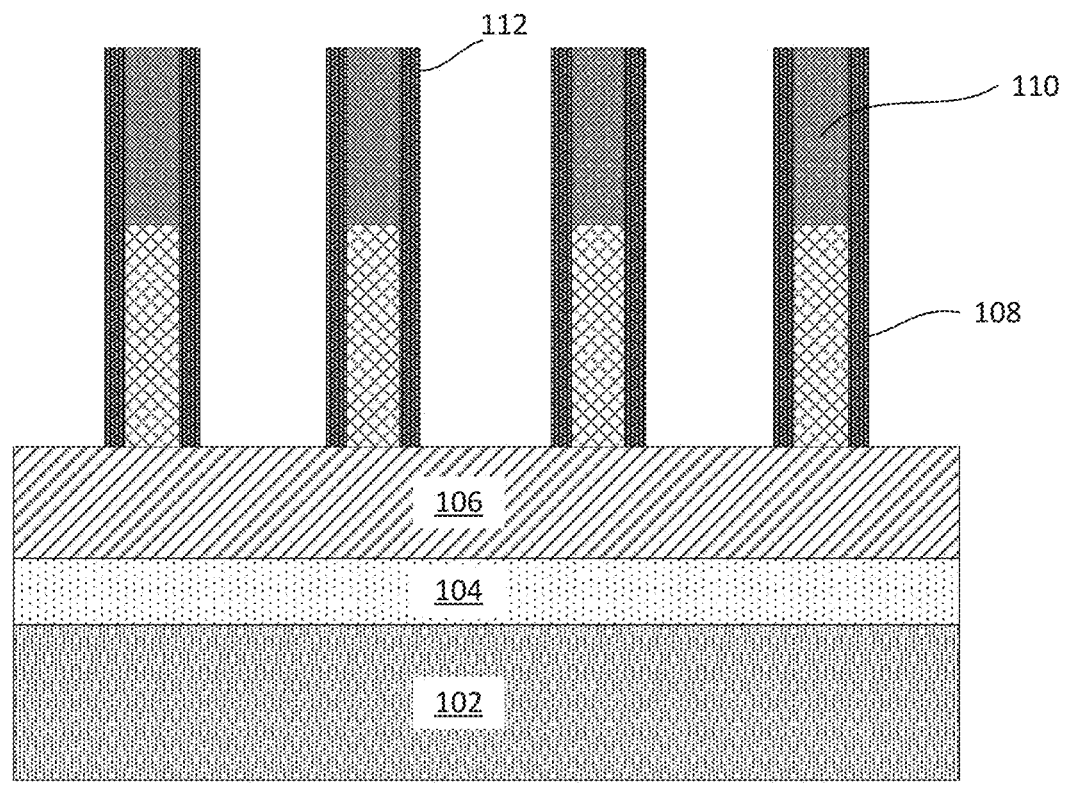

Referring now to FIG. 2A, this figure is a cross-sectional view of the VTFET semiconductor device 100 of FIG. 1A after additional manufacturing operations and taken along the line B-B' of FIG. 2B, according to embodiments. As shown in FIGS. 2A, 2B (a top down view of the VTFET semiconductor device 100 of FIG. 2A) and 2C (a cross-sectional view of the VTFET semiconductor device of FIG. 2A taken along the line A-A' of FIG. 2B), a fin sidewall liner layer 112 (or sacrificial protecting liner) is formed on the sidewall of the fins 108 and sidewalls of the fin hardmask 110. The fin sidewall liner layer 112 can be formed over the fins 108 and the fin hardmask 110 sidewalls to prevent subsequent bottom S/D epi growth from the fin 108 sidewalls. The fin sidewall liner layer 112 may be comprised of, for example, SiN or $SiO_2$, although other suitable materials may also be used. It should be appreciated that in certain examples, the fin sidewall liner layer 112 may be initially formed to cover all surfaces of the semiconductor device 100, and then any suitable directional etching process may be performed to remove the horizontal portions thereof so that only the vertical portions of the fin sidewall liner layer 112 remain.

Figure 3A:
FIG. 3A is a cross-sectional view of the VTFET semiconductor device of FIG. 2A after additional manufacturing operations and taken along the line B-B' of FIG. 3B, according to embodiments.
Figure 3A:
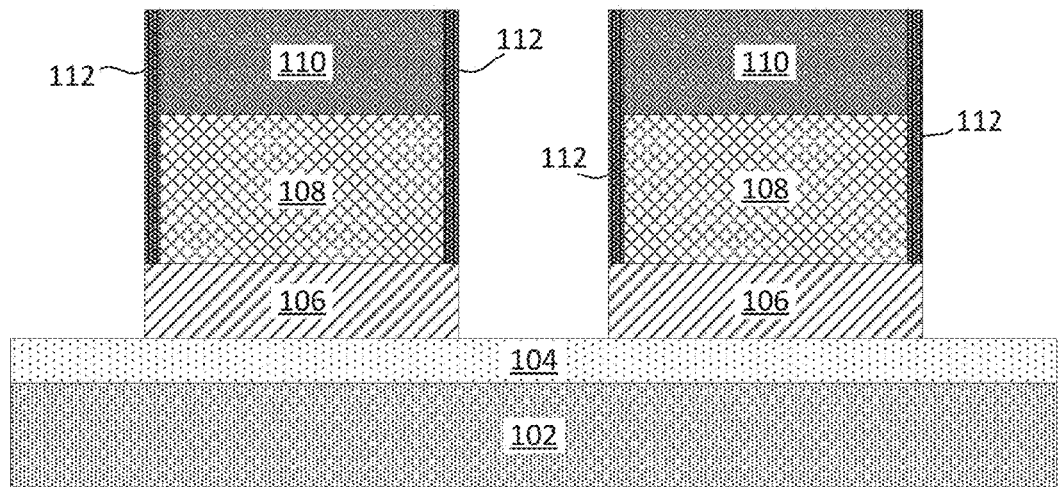
Figure 3B:
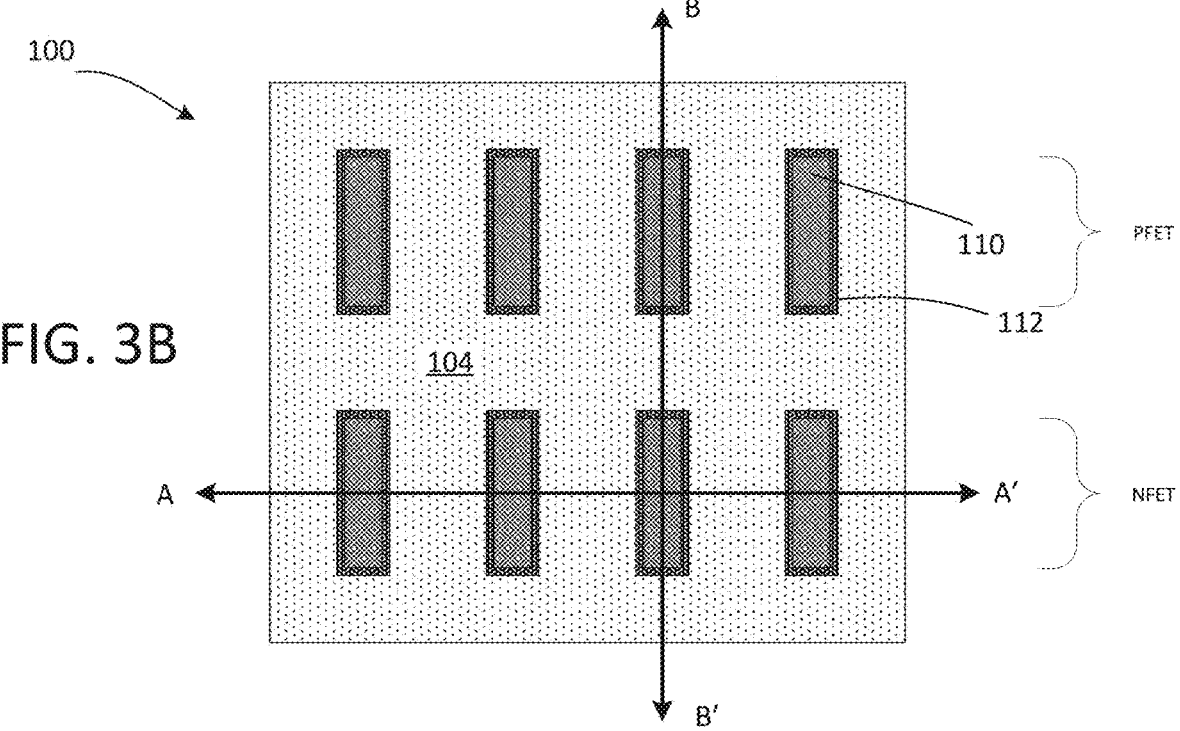
FIG. 3B is a top down view of the VTFET semiconductor device of FIG. 3A, according to embodiments.
Figure 3C:
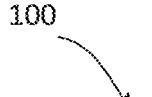
FIG. 3C is a cross-sectional view of the VTFET semiconductor device of FIG. 3A taken along the line A-A' of FIG. 3B, according to embodiments.
Figure 3C:
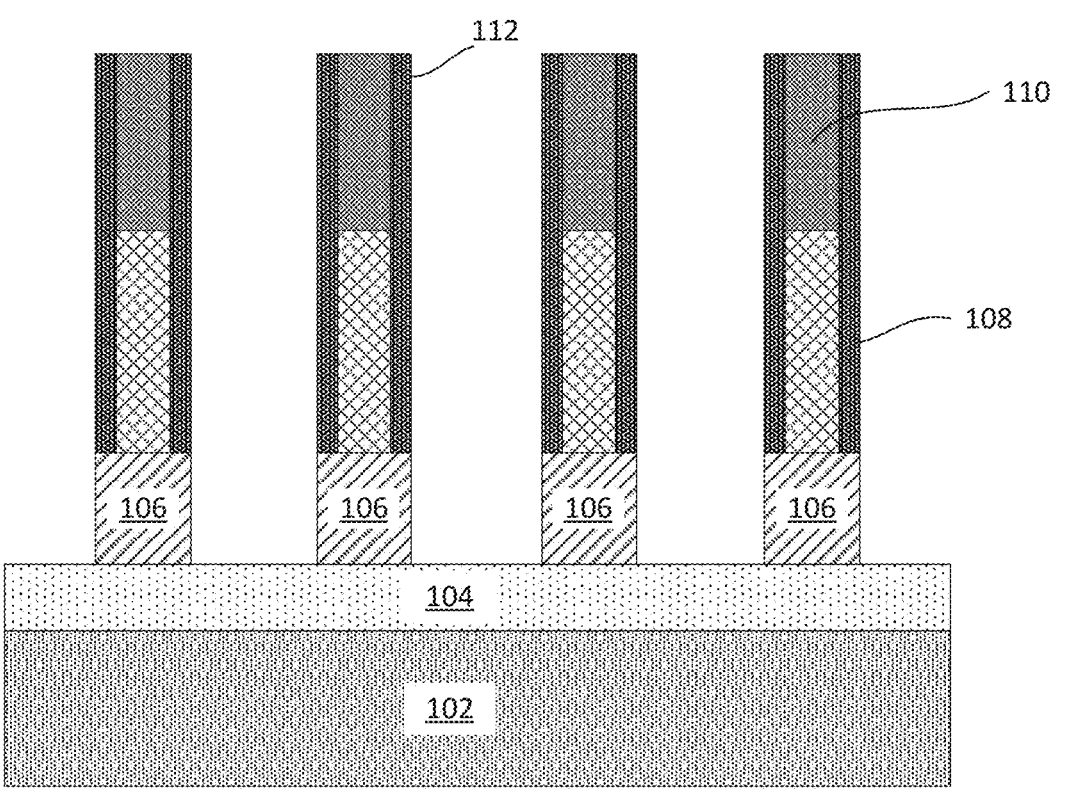

Referring now to FIG. 3A, this figure is a cross-sectional view of the VTFET semiconductor device 100 of FIG. 2A after additional manufacturing operations and taken along the line B-B' of FIG. 3B, according to embodiments. As shown in FIGS. 3A, 3B (a top down view of the VTFET semiconductor device of FIG. 3A) and 3C (a cross-sectional view of the VTFET semiconductor device of FIG. 3A taken along the line A-A' of FIG. 3B), an additional Si recessing operation is performed to remove portions of the semiconductor layer 106 (e.g., the Si layer). This may be performed with reactive ion etching (ME) or any other suitable material removal process. Thus, in areas not covered by the fin hardmask 110 and the fin sidewall liner layer 112, the material of the semiconductor layer 106 is removed to expose the underlying BOX layer 104.

Figure 4A:
FIG. 4A is a cross-sectional view of the VTFET semiconductor device of FIG. 3A after additional manufacturing operations and taken along the line B-B' of FIG. 4B, according to embodiments.
Figure 4A:
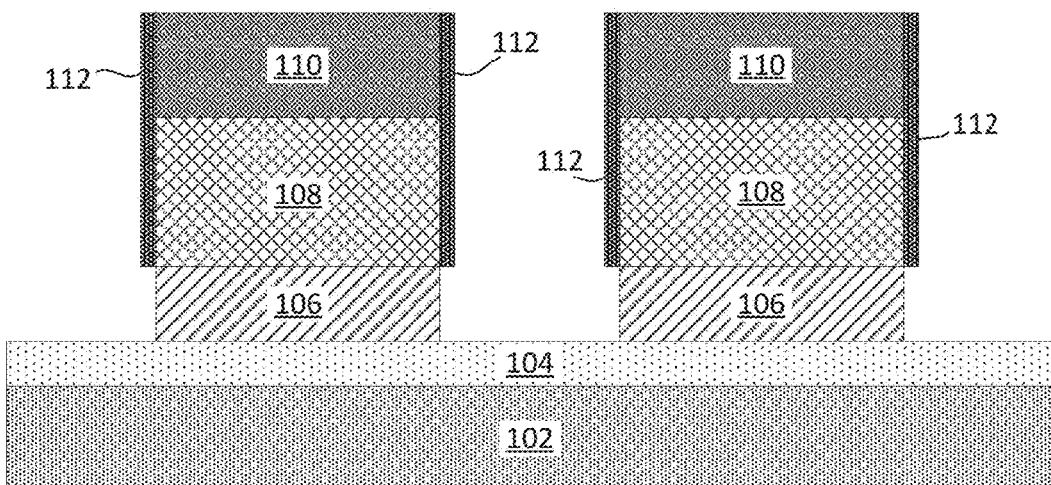
Figure 4B:
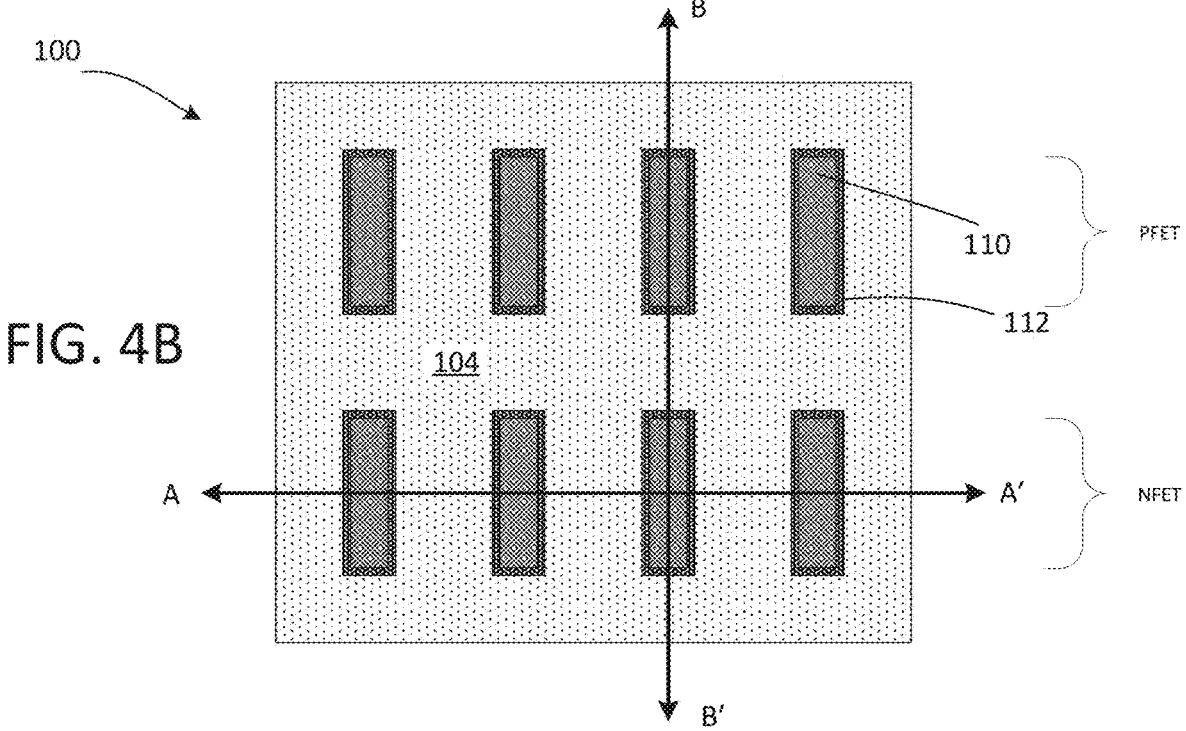
FIG. 4B is a top down view of the VTFET semiconductor device of FIG. 4A, according to embodiments.
Figure 4C:
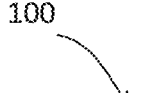
FIG. 4C is a cross-sectional view of the VTFET semiconductor device of FIG. 4A taken along the line A-A' of FIG. 4B, according to embodiments.
Figure 4C:
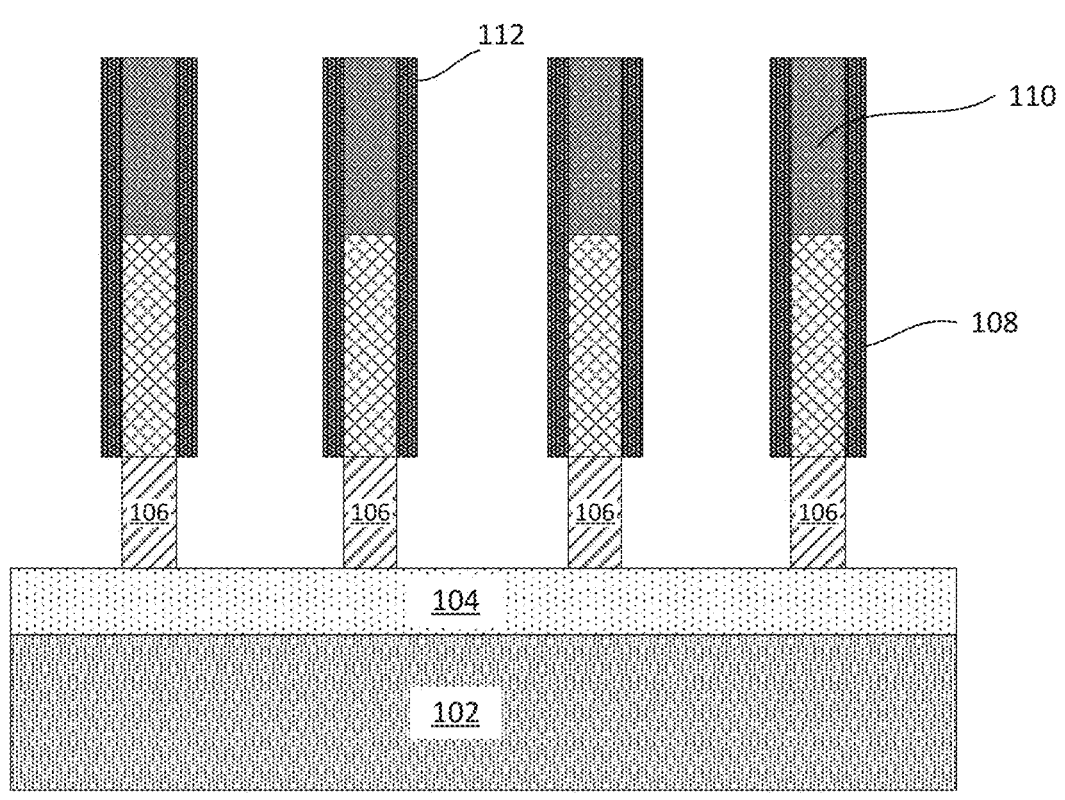

Referring now to FIG. 4A, this figure is a cross-sectional view of the VTFET semiconductor device 100 of FIG. 3A after additional manufacturing operations and taken along the line B-B' of FIG. 4B, according to embodiments. As shown in FIGS. 4A and 4C (a cross-sectional view of the VTFET semiconductor device of FIG. 4A taken along the line A-A' of FIG. 4B), a lateral Si undercut etching operation is performed on the semiconductor layer 106. These recesses may provide for better bottom junction proximity. It should be appreciated that in other embodiments, this step of laterally recessing the semiconductor layer 106 may not be performed.

Figure 5C:
FIG. 5C is a cross-sectional view of the VTFET semiconductor device of FIG. 5A taken along the line A-A' of FIG. 5B, according to embodiments.
Figure 5C:
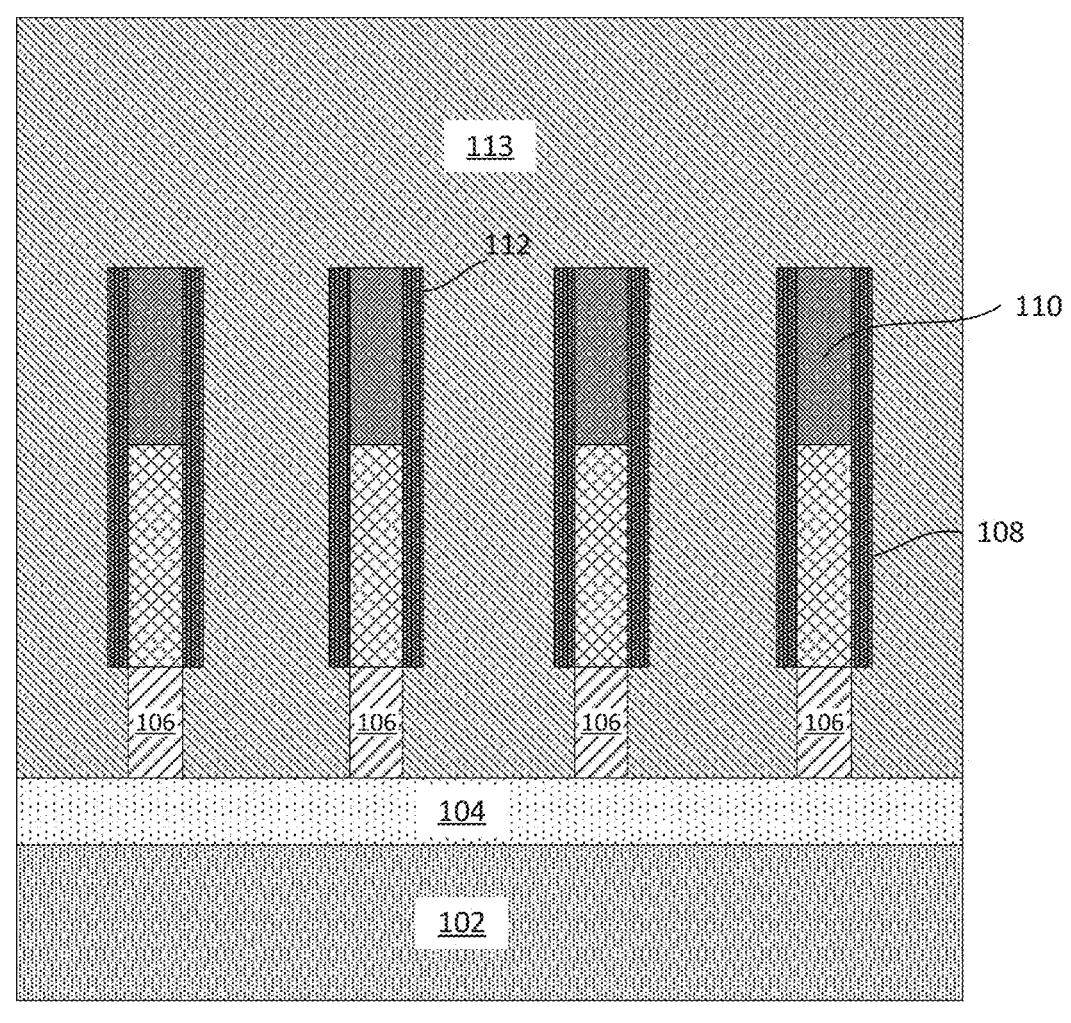

Referring now to FIG. 5A, this figure is a cross-sectional view of the VTFET semiconductor device 100 of FIG. 4A after additional manufacturing operations and taken along the line B-B' of FIG. 5B, according to embodiments. As shown in FIGS. 5A, 5B (a top down view of the VTFET semiconductor device of FIG. 5A) and 5C (a cross-sectional view of the VTFET semiconductor device of FIG. 5A taken along the line A-A' of FIG. 5B), after the lateral etching step of FIGS. 4A-4C is performed, an organic planarization layer (OPL layer) 113 is deposited over the entire semiconductor device 100. That is, the OPL layer 113 is deposited to fill in the areas between adjacent ones of the fins 108 and to fill the recessed areas created by the recessing operation associated with FIGS. 4A-4C.

Figure 6C:
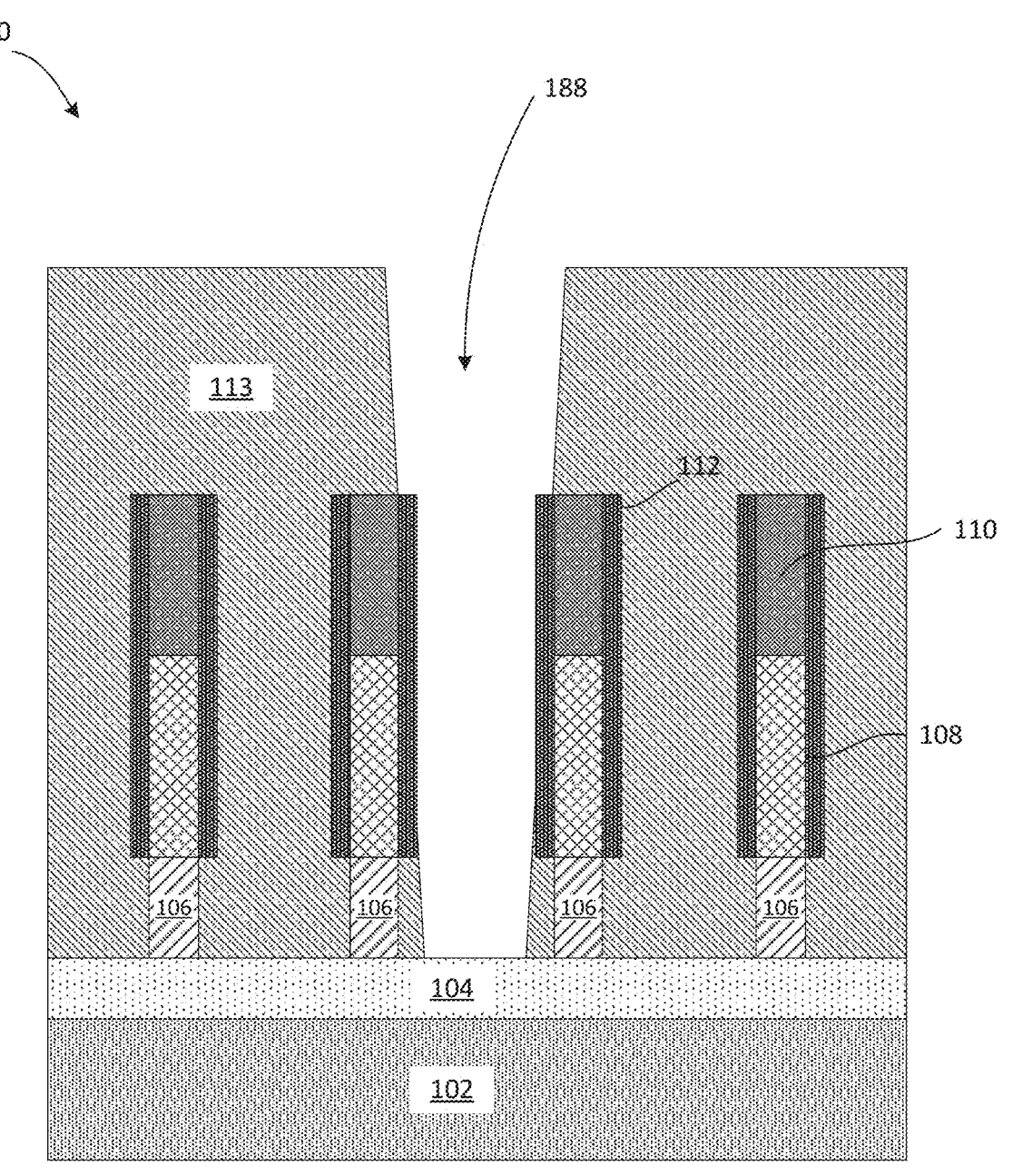
FIG. 6C is a cross-sectional view of the VTFET semiconductor device of FIG. 6A taken along the line A-A' of FIG. 6B, according to embodiments.

Referring now to FIG. 6A, this figure is a cross-sectional view of the VTFET semiconductor device 100 of FIG. 5A after additional manufacturing operations and taken along the line B-B' of FIG. 6B, according to embodiments. As shown in FIGS. 6B (a top down view of the VTFET semiconductor device of FIG. 6A) and 6C (a cross-sectional view of the VTFET semiconductor device of FIG. 6A taken along the line A-A' of FIG. 6B), a portion of the OPL layer 113 is selectively removed with a lithography process to select the locations where the bottom epitaxial layer will connect to the substrate 102. As shown in FIG. 6B, two regions of the OPL layer 113 are opened up to expose the underlying BOX layer 104. In certain examples, top portions of the fin sidewall liner layer 112 are also exposed, as shown in FIG. 6B. As shown in FIG. 6B, a first opening 187 and a second opening 188 are formed. The first opening 187 is between adjacent first and second fins 108 on the upper row of four fins 108 (as shown in FIG. 6B). The second opening 188 is between adjacent second and third fins 108 on the lower row of four fins 108 (as shown in FIG. 6B). As shown in FIG. 6C, the second opening 188 is formed between adjacent fins 108. However, it should be appreciated that in other examples, there may be a different number of openings, or the openings may be in different locations than that indicated in FIG. 6B.

Figure 7C:
FIG. 7C is a cross-sectional view of the VTFET semiconductor device of FIG. 7A taken along the line A-A' of FIG. 7B, according to embodiments.
Figure 7C:
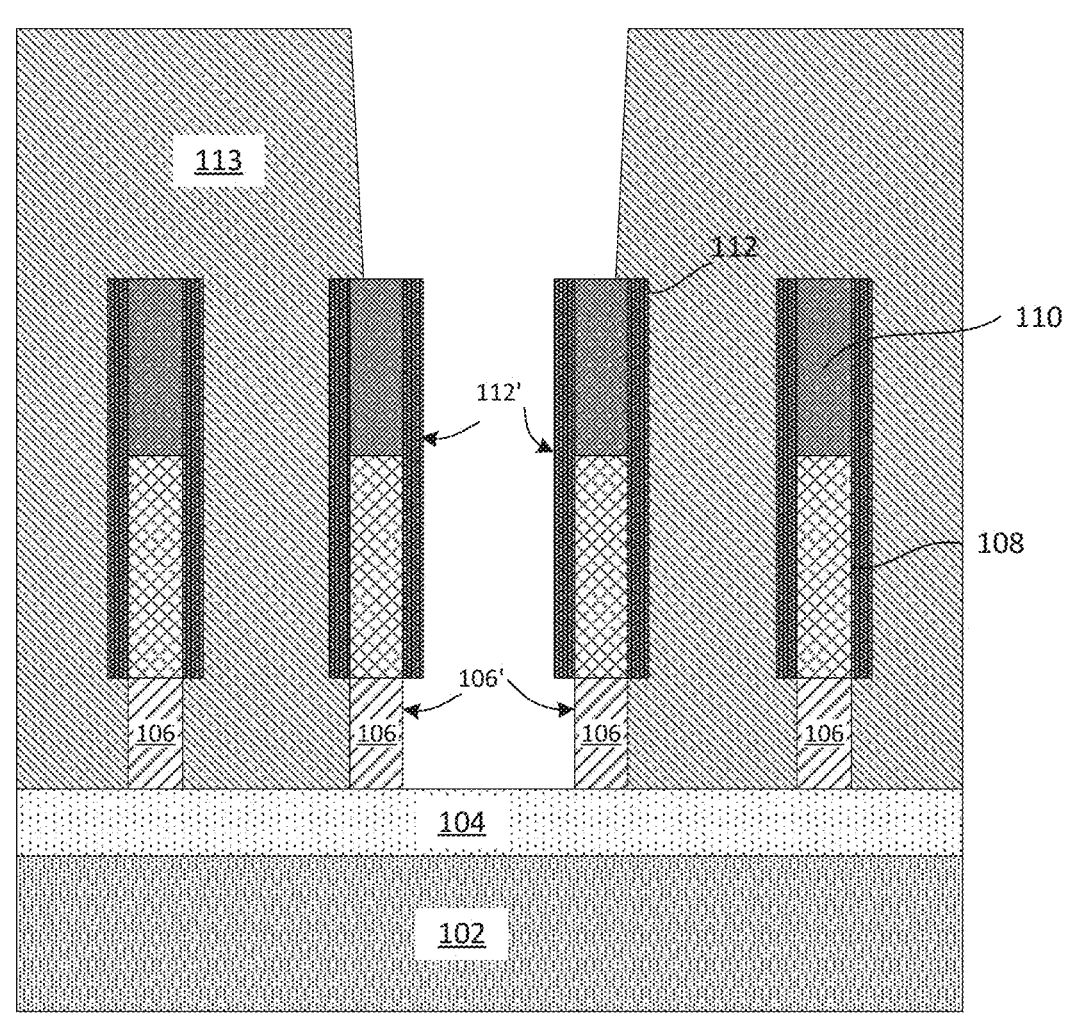

Referring now to FIG. 7A, this figure is a cross-sectional view of the VTFET semiconductor device 100 of FIG. 6A after additional manufacturing operations and taken along the line B-B' of FIG. 7B, according to embodiments. As shown in FIG. 7C (a cross-sectional view of the VTFET semiconductor device of FIG. 7A taken along the line A-A' of FIG. 7B), an optional step of additional OPL layer 113 material removed may be performed to further clean up the OPL layer 113. In FIG. 7C, it is shown that the OPL layer 113 is further removed to expose the sidewalls of the semiconductor layer 106' and the sidewalls of the fin sidewall liner layer 112'.

Figures 8A, 8B:
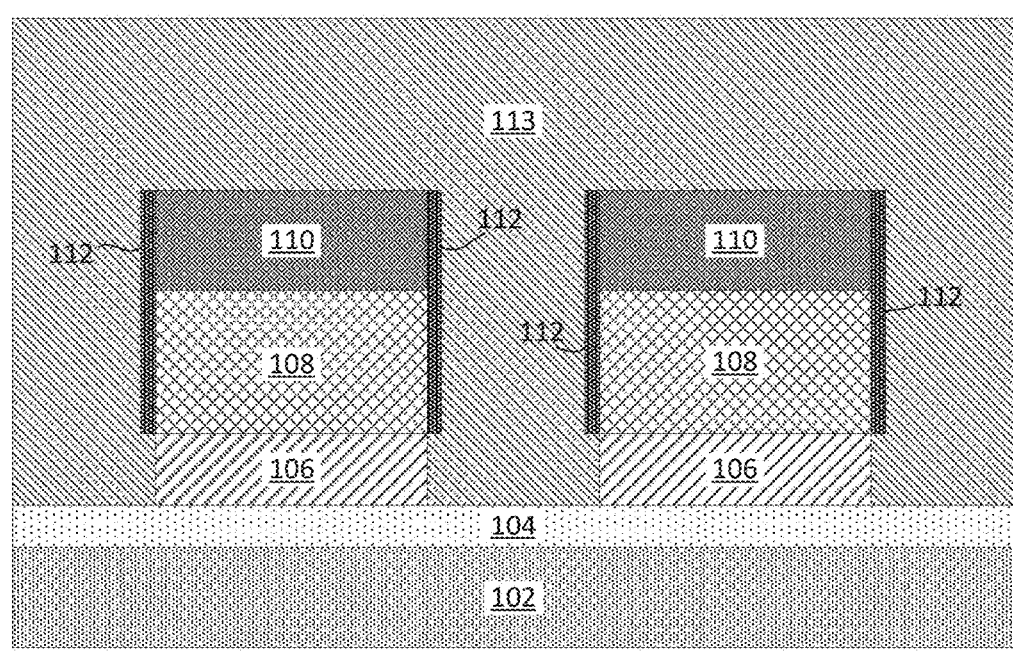
FIG. 8A is a cross-sectional view of the VTFET semiconductor device of FIG. 7A after additional manufacturing operations and taken along the line B-B' of FIG. 8B, according to embodiments.
FIG. 8B is a top down view of the VTFET semiconductor device of FIG. 8A, according to embodiments.
Figure 8C:
FIG. 8C is a cross-sectional view of the VTFET semiconductor device of FIG. 8A taken along the line A-A' of FIG. 8B, according to embodiments.
Figure 8C:
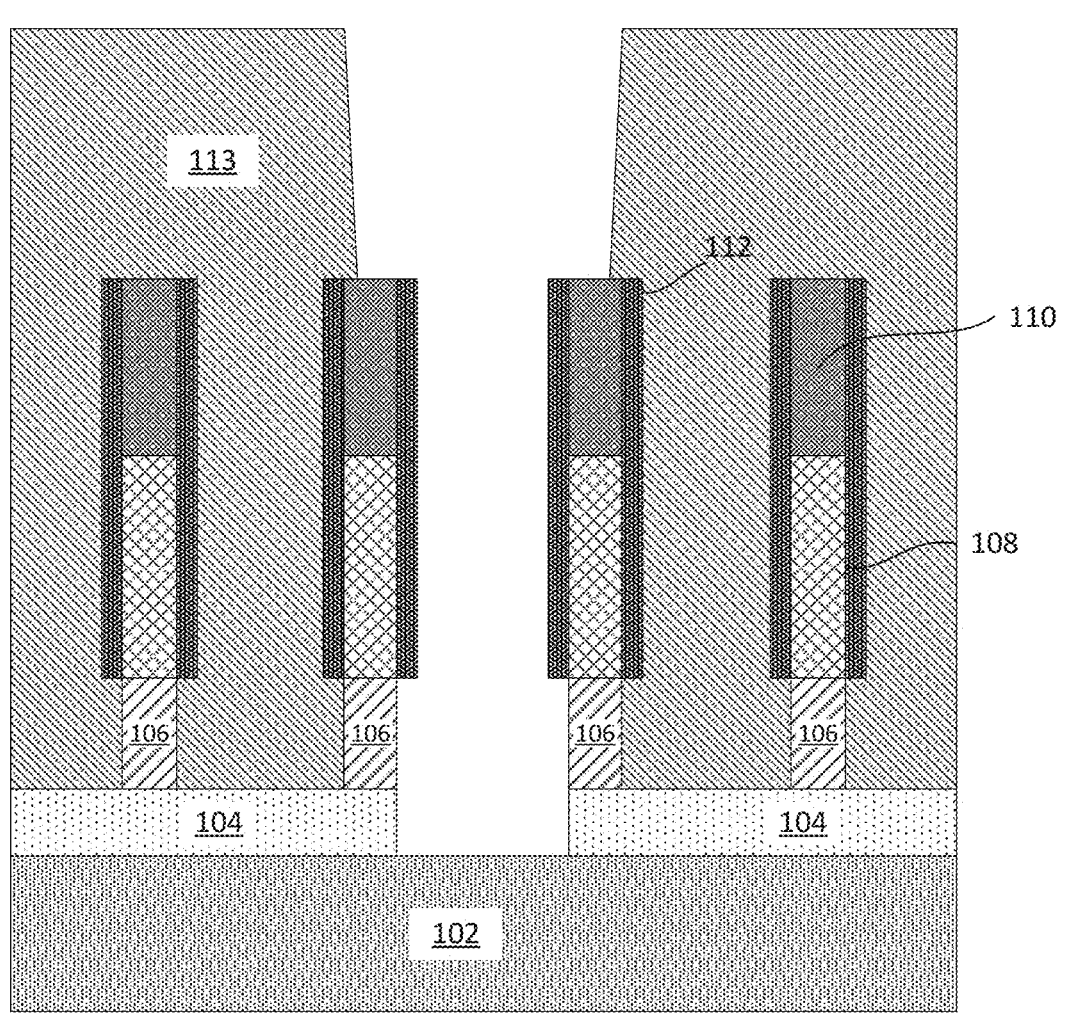

Referring now to FIG. 8A, this figure is a cross-sectional view of the VTFET semiconductor device 100 of FIG. 7A after additional manufacturing operations and taken along the line B-B' of FIG. 8B, according to embodiments. As shown in FIGS. 8B (a top down view of the VTFET semiconductor device of FIG. 8A) and 8C (a cross-sectional view of the VTFET semiconductor device of FIG. 8A taken along the line A-A' of FIG. 8B) an exposed portion of the BOX layer 104 is removed between the sets of adjacent fins 108 identified with respect to FIG. 6B. After the removal of these portions of the BOX layer 104, the substrate 102 is exposed in these regions corresponding to the first opening 187 and the second opening 188.

Figure 9C:
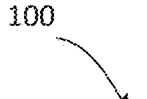
FIG. 9C is a cross-sectional view of the VTFET semiconductor device of FIG. 9A taken along the line A-A' of FIG. 9B, according to embodiments.
Figure 9C:
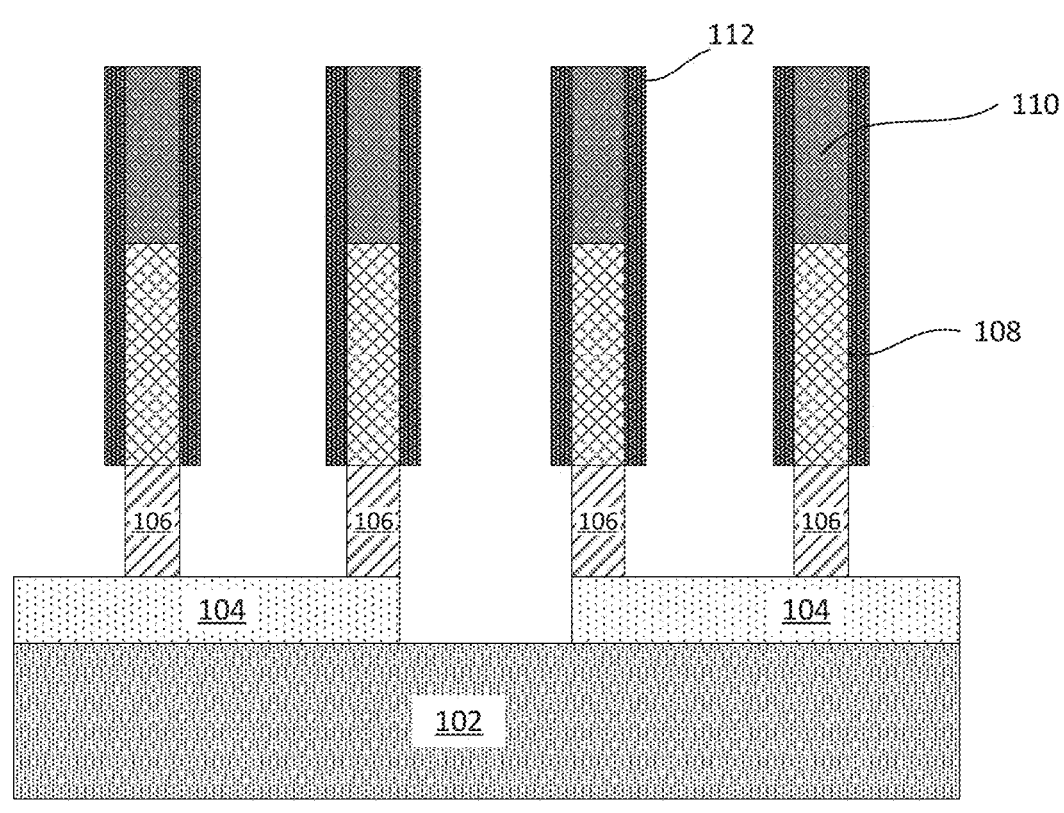

Referring now to FIG. 9A, this figure is a cross-sectional view of the VTFET semiconductor device 100 of FIG. 8A after additional manufacturing operations and taken along the line B-B' of FIG. 9B, according to embodiments. As shown in FIGS. 9A, 9B (a top down view of the VTFET semiconductor device of FIG. 9A) and 9C (a cross-sectional view of the VTFET semiconductor device of FIG. 9A taken along the line A-A' of FIG. 9B), the OPL layer 113 is completely removed to expose additional portions of the BOX layer 104. As shown in FIG. 9B, the substrate 102 is only exposed in areas corresponding to the first opening 187 and the second opening 188.

Figure 10C:
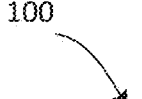
FIG. 10C is a cross-sectional view of the VTFET semiconductor device of FIG. 10A taken along the line A-A' of FIG. 10B, according to embodiments.
Figure 10C:
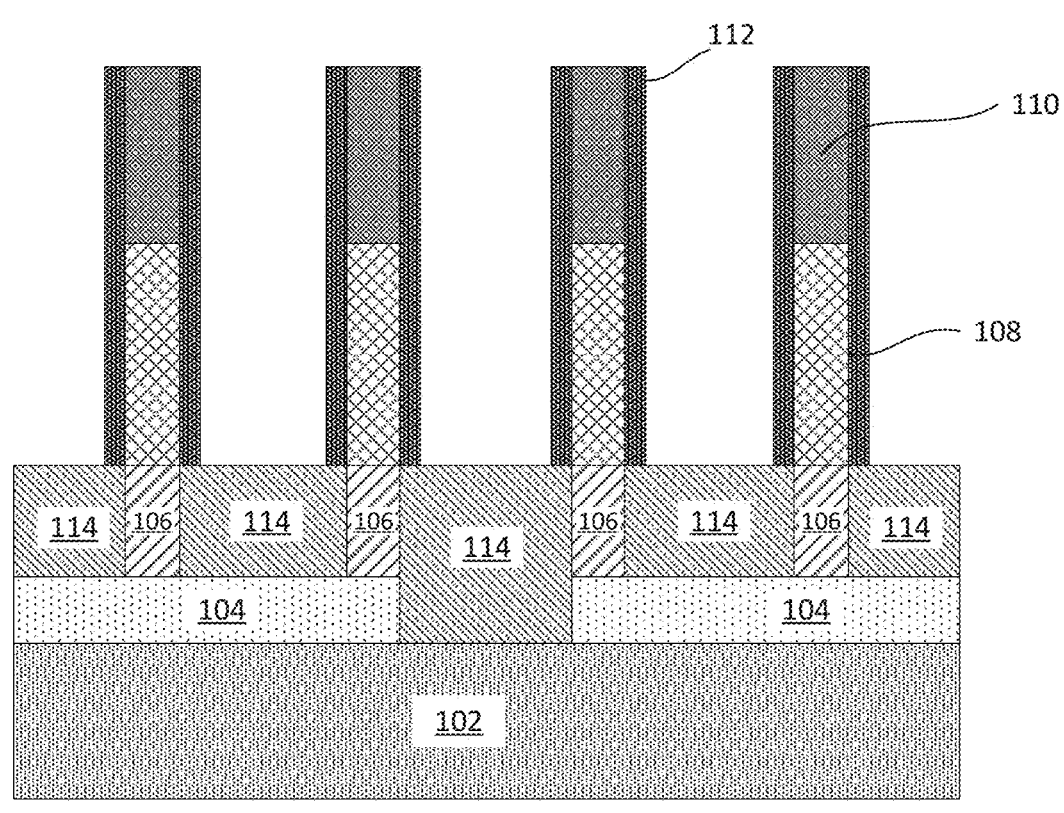

FIG. 10A is a cross-sectional view of the VTFET semiconductor device 100 of FIG. 9A after additional manufacturing operations and taken along the line B-B' of FIG. 10B, according to embodiments. As shown in FIG. 10A, 10B (a top down view of the VTFET semiconductor device of FIG. 10A) and 10C (a cross-sectional view of the VTFET semiconductor device of FIG. 10A taken along the line A-A' of FIG. 10B), the bottom epitaxial layer 114 (i.e., a bottom source/drain (S/D) epi) is epitaxially formed on the substrate 102. According to an embodiment, the bottom epitaxial layer 114 (or bottom source/drain regions) includes, if it is a pFET boron doped SiGe or Si (less preferred), or if it is an nFET phosphorus or arsenic doped silicon. However, it should be appreciated that other suitable materials may be used for the bottom epitaxial layer 114.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 400° C. to 900°

C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

Referring again to FIG. 10C, it can be seen that in the selected regions corresponding to the first opening 187 and the second opening 188 (see also, FIG. 9B where the substrate 102 is exposed), the first epitaxial layer 114 is grown directly on the substrate 102, whereas other portions of the first epitaxial layer 114 are grown on the BOX layer 104.

Figures 11A, 11B:
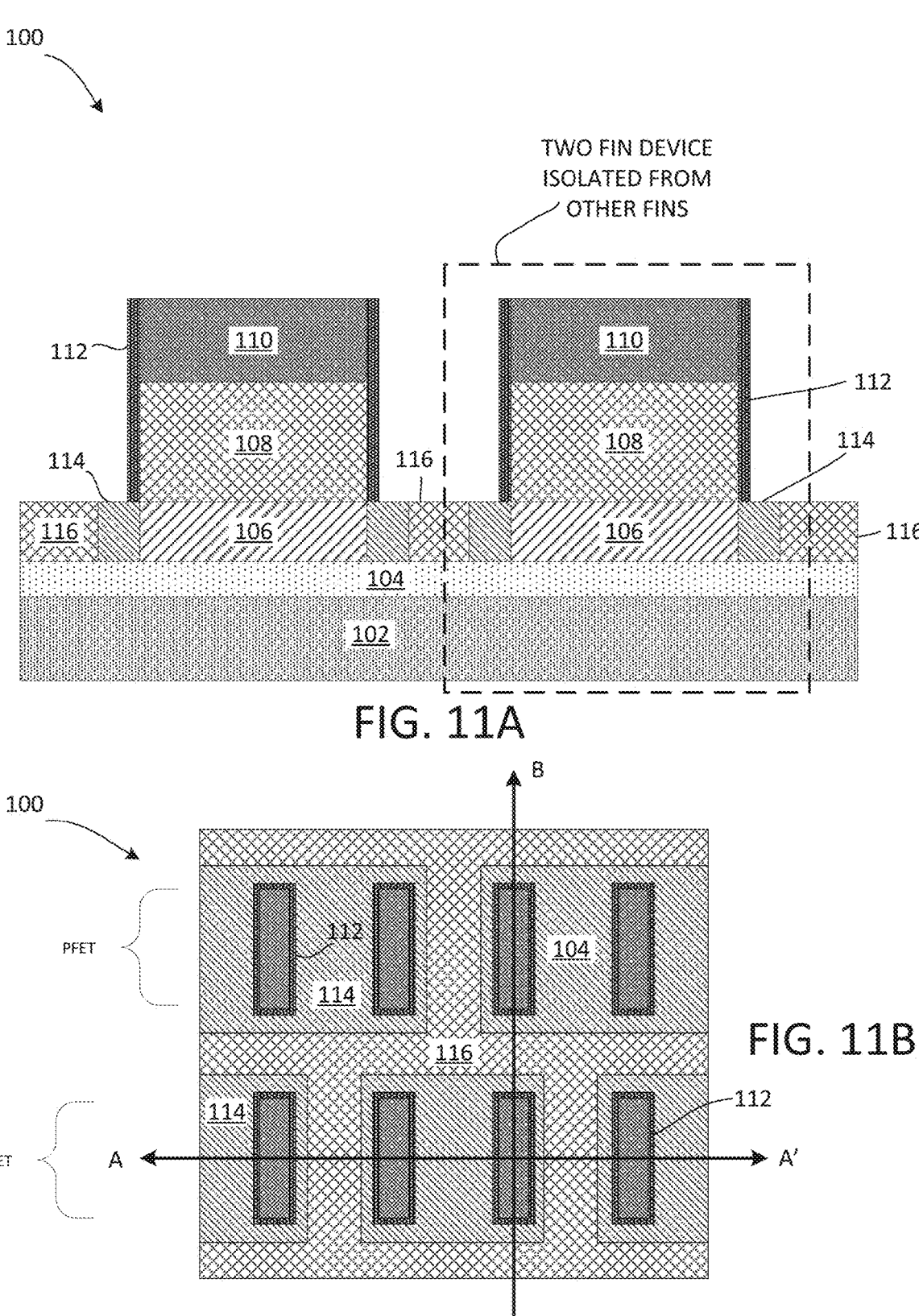
FIG. 11A is a cross-sectional view of the VTFET semiconductor device of FIG. 10A after additional manufacturing operations and taken along the line B-B' of FIG. 11B, according to embodiments.
FIG. 11B is a top down view of the VTFET semiconductor device of FIG. 11A, according to embodiments.
Figure 11C:
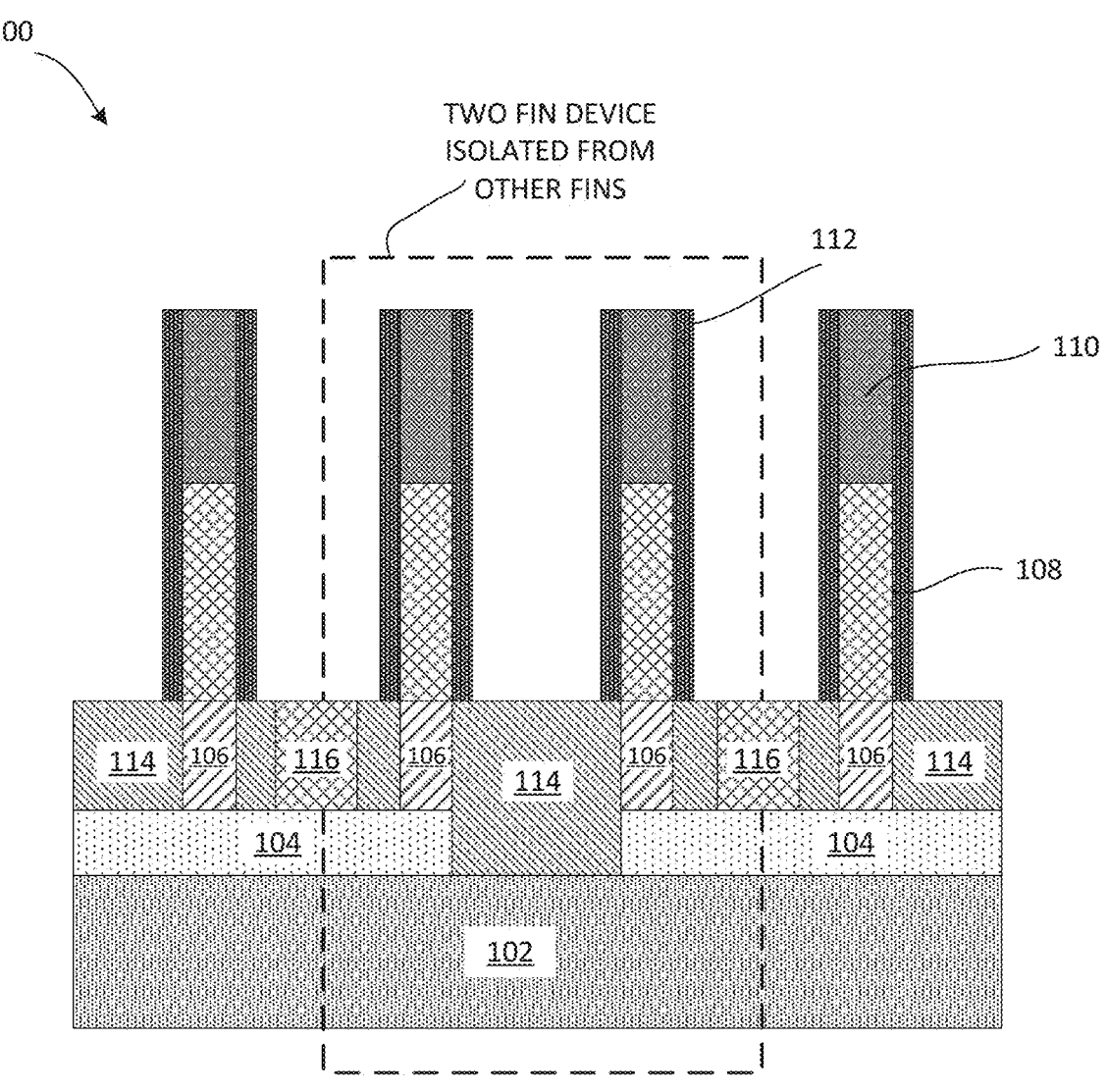
FIG. 11C is a cross-sectional view of the VTFET semiconductor device of FIG. 11A taken along the line A-A' of FIG. 11B, according to embodiments.

Referring now to FIG. 11A, this figure is a cross-sectional view of the VTFET semiconductor device 100 of FIG. 10A after additional manufacturing operations and taken along the line B-B' of FIG. 11B, according to embodiments. As shown in FIG. 11A, 11B (a top down view of the VTFET semiconductor device of FIG. 11A) and 11C (a cross-sectional view of the VTFET semiconductor device of FIG. 11A taken along the line A-A' of FIG. 11B), shallow trench isolation (STI) regions 116 may be formed in various locations throughout the bottom epitaxial layer 114. In general, STI (also known as a shallow trench isolation technique) is an integrated circuit feature which prevents electric current leakage between adjacent semiconductor device components. STI is generally used on CMOS process technology nodes of 250 nanometers and smaller. The STI regions 116 may have a height or vertical thickness in the range of 50 to 400 nm, although other dimensions are applicable as well. It should be appreciated that the positions and locations of the various components (e.g., STI regions 116, transistor fins 108) may be varied in any suitable manner according to the specific application. As shown in FIG. 11B, the STI regions 116 are formed in such a manner as to create a two fin device that is separated from other fins (see also FIGS. 11A and 11C).

Figure 12C:
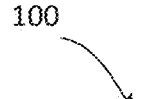
FIG. 12C is a cross-sectional view of the VTFET semiconductor device of FIG. 12A taken along the line A-A' of FIG. 12B, according to embodiments.
Figure 12C:
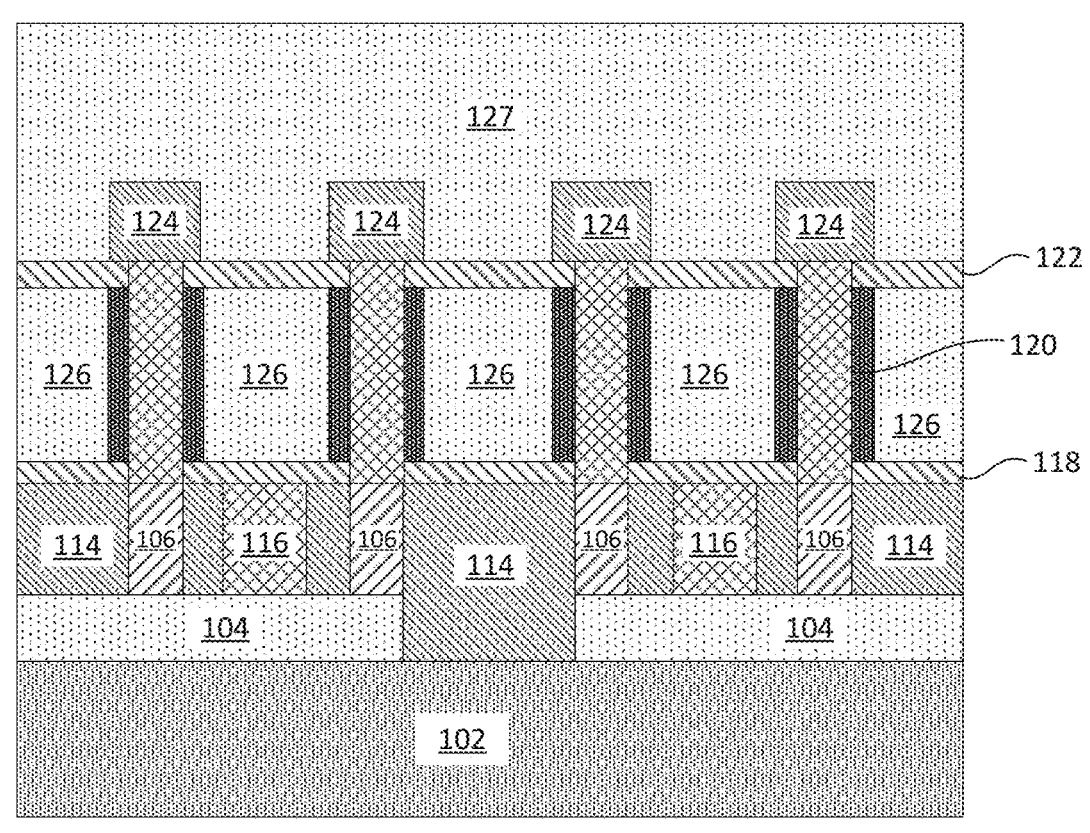

Referring now to FIG. 12A, this figure is a cross-sectional view of the VTFET semiconductor device 100 of FIG. 11A after additional manufacturing operations and taken along the line B-B' of FIG. 12B, according to embodiments. As shown in FIGS. 12A and 12C (a cross-sectional view of the VTFET semiconductor device of FIG. 12A taken along the line A-A' of FIG. 12B), several additional processing steps are performed. Although not shown in FIGS. 11A-11C, the fin hardmask 110 and the fin sidewall liner layer 112 are removed. A bottom spacer 118 is formed on the bottom epitaxial layer 114 and over the STI regions 116. The bottom spacer 118 may be formed using various processing, such as non-conformal deposition and etch-back processing (e.g., physical vapor deposition (PVD), high density plasma (HDP) deposition, etc.). The bottom spacer 118 may be formed of a dielectric material such as $SiO_2$, SiN, silicon carbide oxide (SiCO), silicon boron carbide nitride (SiBCN), etc. The bottom spacer 118 may have a height or vertical thickness in the range of 3 to 10 nm, although other dimensions are applicable as well.

As shown in FIG. 12C, a gate 120 (or gate electrode, or gate stack) on sidewalls of the fins 108. The gate 120 may be, for example, comprised of a high-K metal gate material and a gate conductor material (in certain examples formed as two separate layers). As shown in FIG. 12A, the gate 120 is also formed on the bottom spacer 118 in the middle of FIG. 12A.

The high-K metal gate material of the gate 120 may be formed of a high-K dielectric material. Examples of high-K materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-K material may further include dopants such as lanthanum (La), aluminum (Al), and magnesium (Mg).

The gate conductor material of the gate 120 may include a metal gate or work function metal (WFM). In some embodiments, the gate conductor material may be formed using atomic layer deposition (ALD) or another suitable process. For nFET devices, the WFM for the gate conductor may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor material as desired.

The gate 120 stack (e.g., high-x material layer and gate conductor material layer) may collectively have a height or vertical thickness in the range of 10 to 30 nm on vertical sidewalls of the lower vertical fin 108 although other dimensions are applicable as well.

A first interlayer dielectric (ILD) layer 126 is formed between the fins 108 and then a top spacer 122 is formed on the first ILD layer 126. The ILD layer 126 may be formed of any suitable isolation material, such as $SiO_2$, SiOC, SiON, etc. The top spacer 122 for the VTFETs may be formed surrounding and contacting a portion of the vertical sidewalls of the fins 108. The top spacer 122 may further be formed on and in contact with the gate 120 and the second ILD layer 127. The top spacer 122 may be formed of similar materials and with similar sizing as that discussed above with respect to bottom spacer 118.

A top epitaxial layer 124 (i.e., a top source/drain (S/D) epi) is epitaxially formed on the fins 108. According to an embodiment, the top epitaxial layer 124 (or top source/drain regions) includes, if it is a pFET boron doped SiGe or Si (less preferred), or if it is an nFET phosphorus or arsenic doped silicon. However, it should be appreciated that other suitable materials may be used for the top epitaxial layer 124. Then, a second ILD layer 127 is formed on the fins 108 and between the portions of the top epitaxial layer 124. In certain embodiments, optionally, all of the MOL and BEOL interconnects (not shown) except for the power rails (i.e., the buried power rails (BPRs)) may be formed.

Figure 13A:
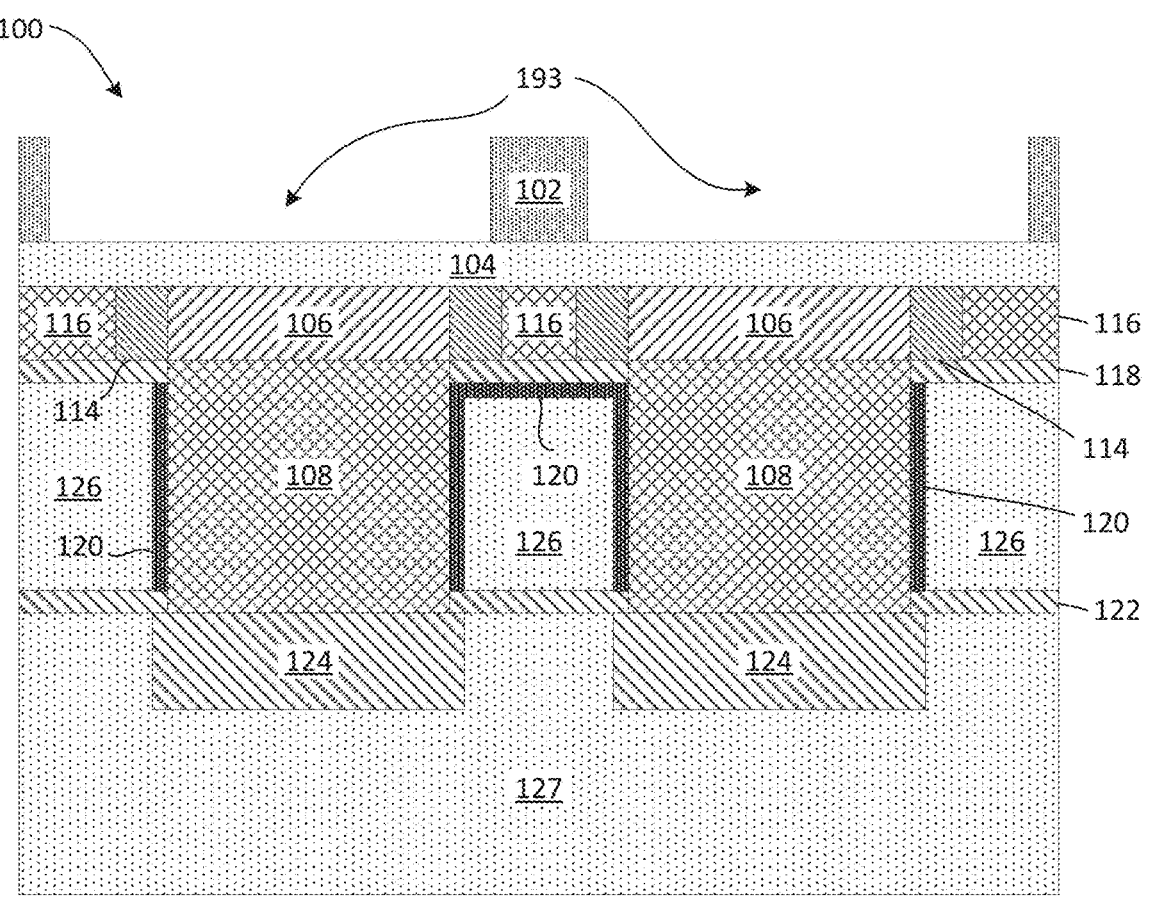
FIG. 13A is a cross-sectional view of the VTFET semiconductor device of FIG. 12A after additional manufacturing operations and taken along the line B-B' of FIG. 13B, according to embodiments.
Figure 13B:
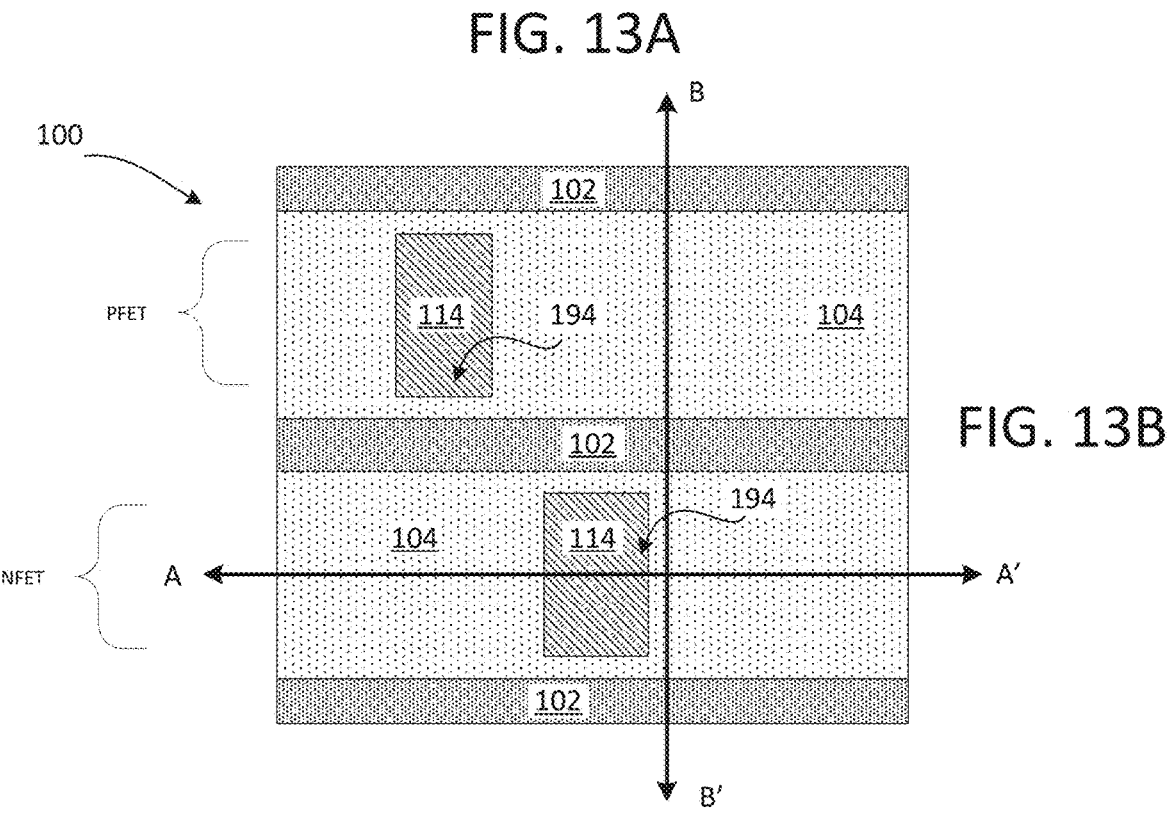
FIG. 13B is a top down view of the VTFET semiconductor device of FIG. 13A, according to embodiments.
Figure 13C:
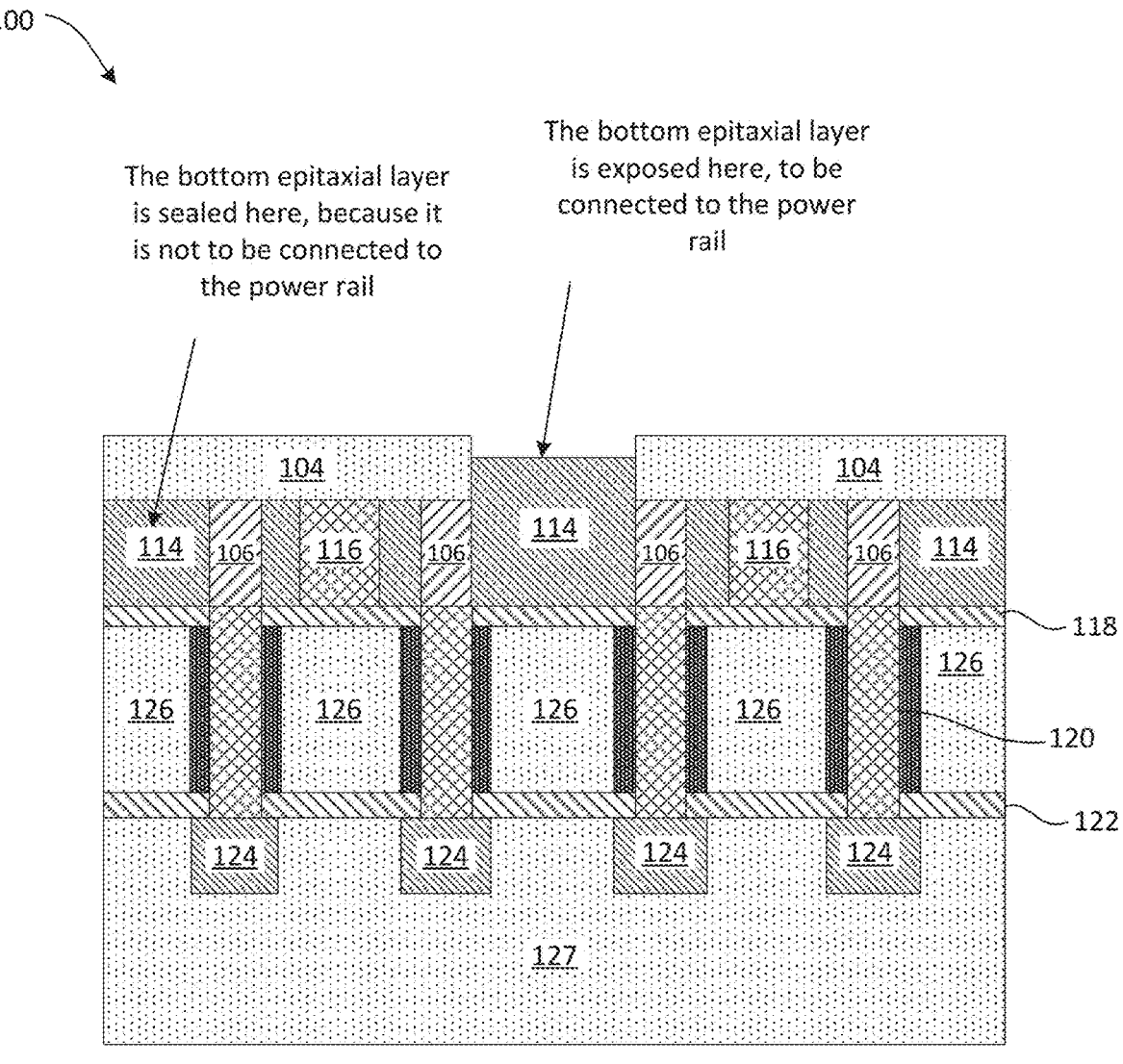
FIG. 13C is a cross-sectional view of the VTFET semiconductor device of FIG. 13A taken along the line A-A' of FIG. 13B, according to embodiments.

Referring now to FIG. 13A, this figure is a cross-sectional view of the VTFET semiconductor device 100 of FIG. 12A after additional manufacturing operations and taken along the line B-B' of FIG. 13B, according to embodiments. As shown in FIGS. 13A, 13B (a top down view of the VTFET semiconductor device of FIG. 13A) and 13C (a cross-sectional view of the VTFET semiconductor device of FIG. 13A taken along the line A-A' of FIG. 13B), the semiconductor device 100 has been flipped upside down relative to the previous figures. In certain embodiments, the second ILD layer 127 may optionally be mounted to a carrier substrate (not shown). As shown in FIG. 13A, in certain embodiments, the substrate 102 may be thinned down, and then lithography is performed to create BPR openings 193 for the subsequent formation of the buried power rails (BPRs). For example, a mask layer (not shown) may be patterned over the top surface of the substrate 102. An etching process such as RIE or other suitable processing may be performed to remove exposed portions of the substrate 102. For example, the BPR openings 193 may be formed by the ME process that exposes the BOX layer 104 and portions of the bottom epitaxial layer 114 in regions 194 (see, FIG. 13B). The sacrificial layer may then be removed using an etch process that removes the sacrificial material of these layers selective to the remaining materials/layers (e.g., the remaining portions of the substrate 102). As a result, a cavity is formed that exposes portions of the upper VTFET bottom source/drain region (or bottom epitaxial layer 114).

Figure 14A:
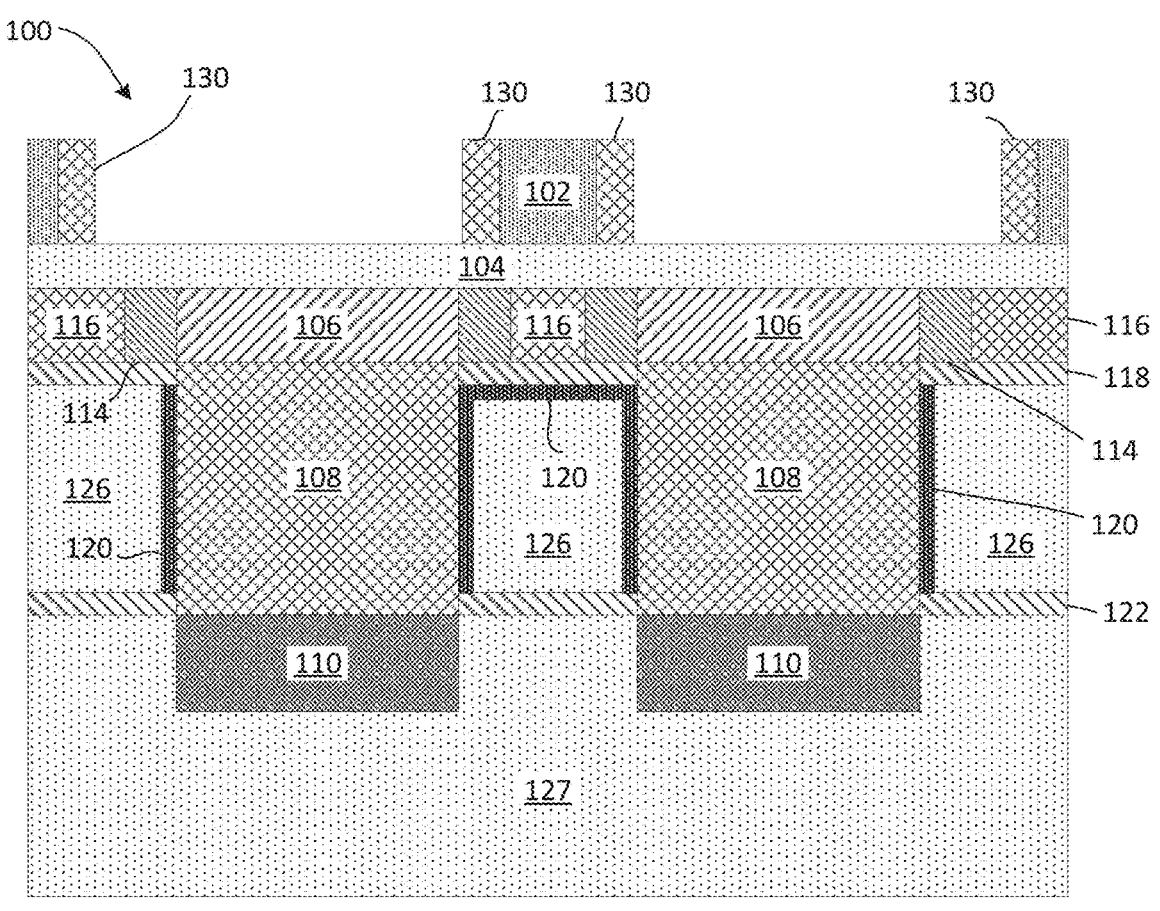
FIG. 14A is a cross-sectional view of the VTFET semiconductor device of FIG. 13A after additional manufacturing operations and taken along the line B-B' of FIG. 14B, according to embodiments.
Figure 14B:
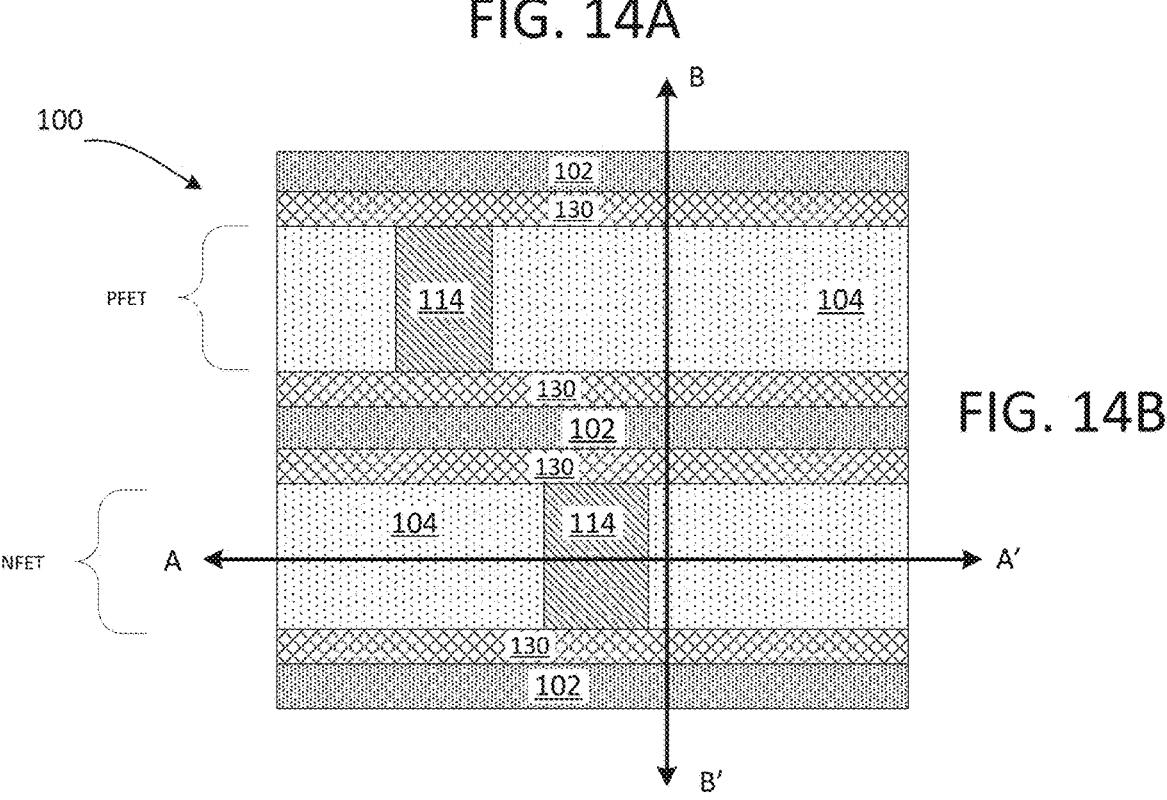
FIG. 14B is a top down view of the VTFET semiconductor device of FIG. 14A, according to embodiments.
Figure 14C:
FIG. 14C is a cross-sectional view of the VTFET semiconductor device of FIG. 14A taken along the line A-A' of FIG. 14B, according to embodiments.
Figure 14C:
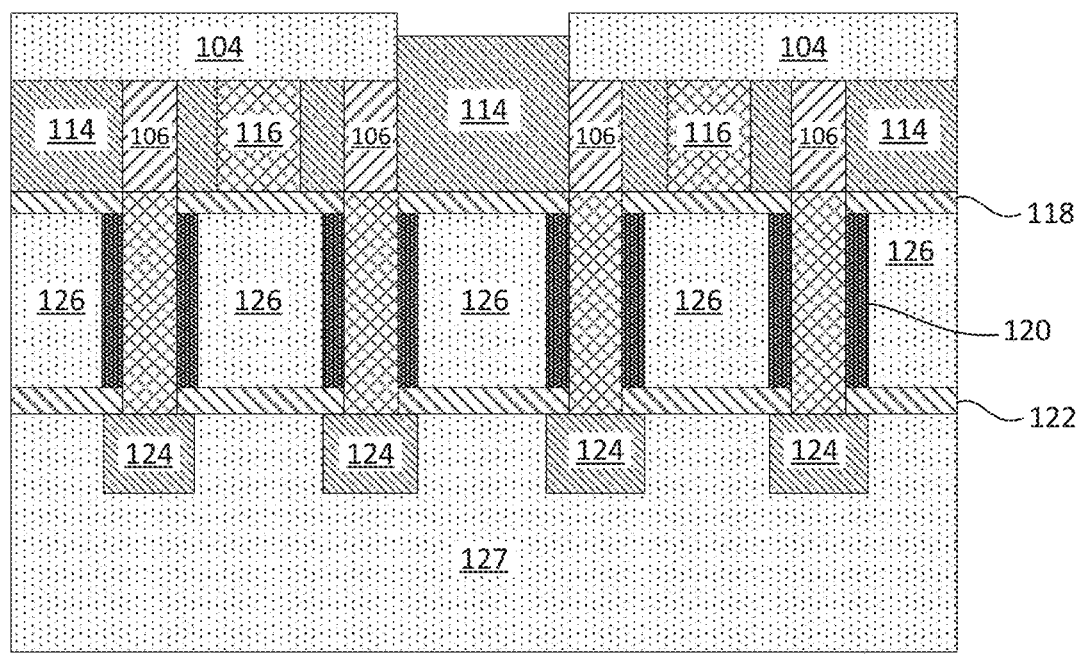

Referring now to FIG. 14A, this figure is a cross-sectional view of the VTFET semiconductor device of FIG. 13A after additional manufacturing operations and taken along the line B-B' of FIG. 14B, according to embodiments. As shown in FIGS. 14A and 14B (a top down view of the VTFET semiconductor device of FIG. 14A), a sidewall liner 130 is formed for isolation purposes.

Figure 15A:
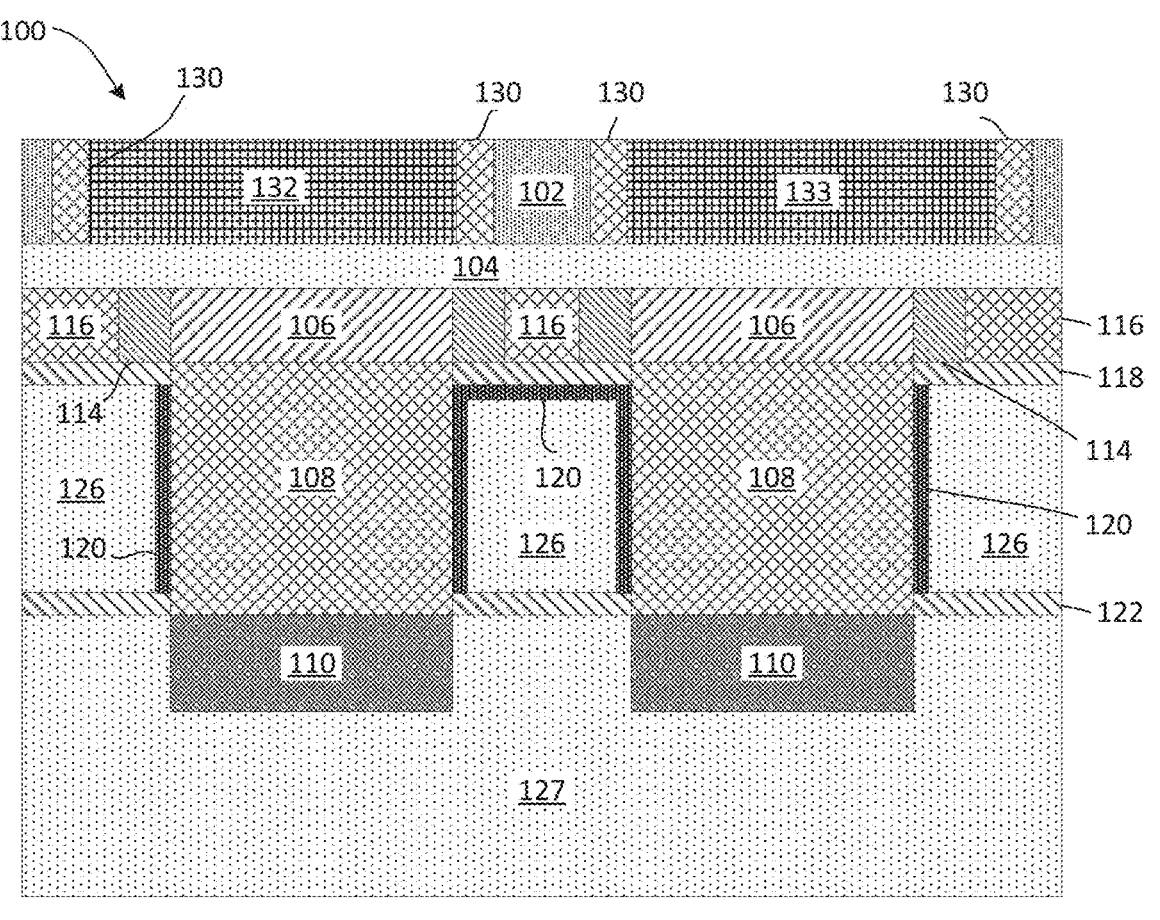
FIG. 15A is a cross-sectional view of the VTFET semiconductor device of FIG. 14A after additional manufacturing operations and taken along the line B-B' of FIG. 15B, according to embodiments.
Figure 15B:
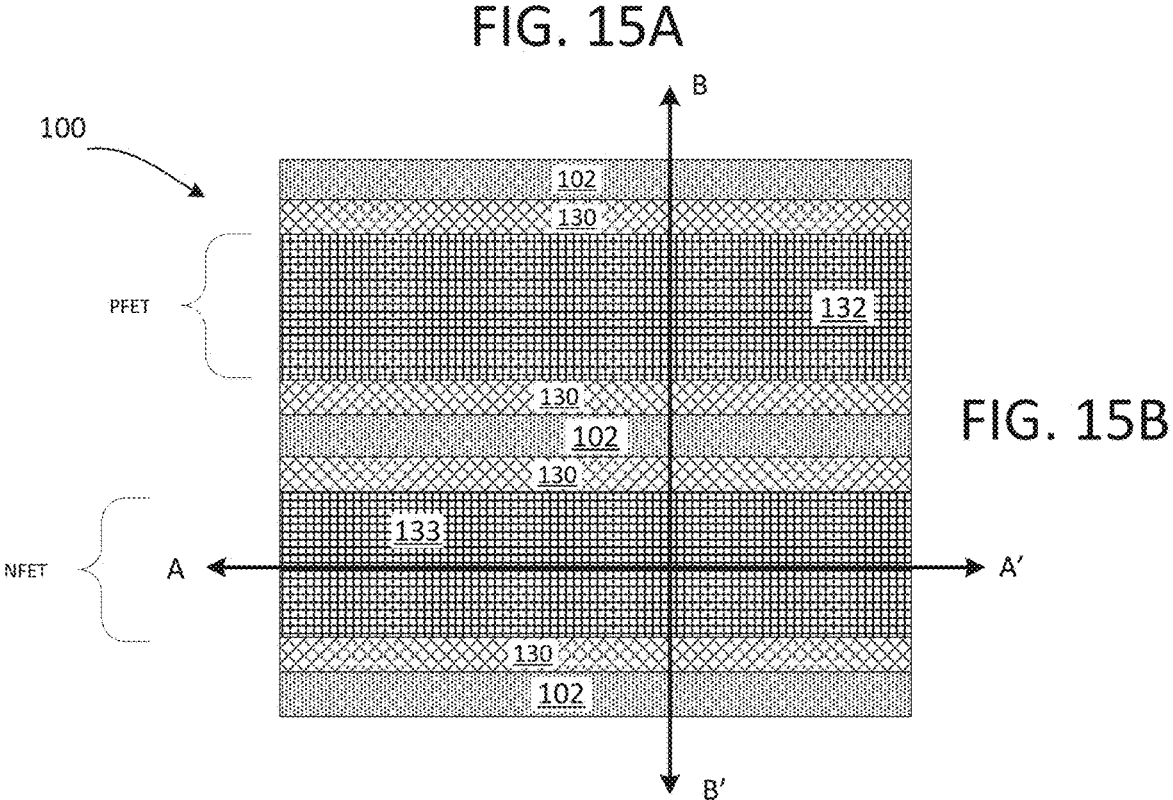
FIG. 15B is a top down view of the VTFET semiconductor device of FIG. 15A, according to embodiments.

Referring now to FIG. 15A, this figure is a cross-sectional view of the VTFET semiconductor device 100 of FIG. 14A after additional manufacturing operations and taken along the line B-B' of FIG. 15B, according to embodiments. As shown in FIG. 15A, 15B (a top down view of the VTFET semiconductor device of FIG. 15A) and 15C (a cross-sectional view of the VTFET semiconductor device of FIG. 15A taken along the line A-A' of FIG. 15B), the channels/cavities may then be filled with a contact material to form the contact 132, which will become the Vdd power line for the semiconductor device 100, and the second contact 133, which will become the buried ground (GND) for the semiconductor device 100. The contact material may be tungsten (W), cobalt (Co), or another suitable material. In some embodiments, any overburden contact material may be planarized down to the upper surface (as shown in the flipped upside down view of FIG. 15A) of the substrate 102. In certain embodiments, a silicide layer (not shown) may be formed at the interface between the contact 132 and the bottom epitaxial layer 114, Although not shown in the figures, processing may continue form the remaining power/ground grid. For example, the Vdd power line (or contact 132) and the GND line (or second contact 133) may be respectively coupled to subsequently formed power and ground rails. Then, the entire power delivery grid, which may comprise at least two metal levels with lines running perpendicular to each other, may be formed on top of the power and ground rails.

In certain embodiments, there can be multiple Vdd power lines (or Vdd rails) that are connected to a P-type VTFET epitaxial layer and ground rails that are connected to an N-type VTFET epitaxial layer. Thus, a power rail may refer to arrays of both Vdd and GND rails.

Figure 15C:
FIG. 15C is a cross-sectional view of the VTFET semiconductor device of FIG. 15A taken along the line A-A' of FIG. 15B, according to embodiments.
Figure 15C:
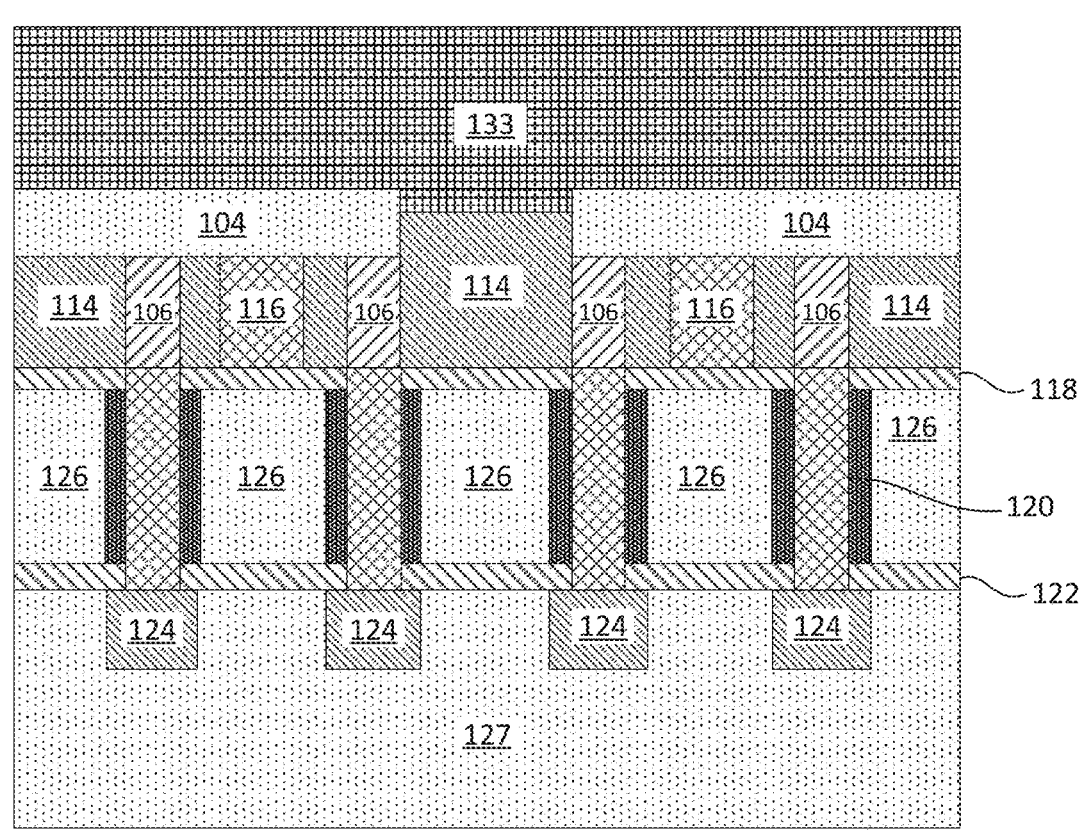

Thus, as shown in FIG. 15C, the second contact 133 directly contacts the bottom epitaxial layer 114, while the other portions of the bottom epitaxial layer 114 are separated from the contact 132 and the second contact 133 by the BOX layer 104. Therefore, the bottom epitaxial layer 104 of the semiconductor device 100 connects to the buried power rail except for the fins 108 and epis at the device edge which abuts to the STI regions 116. Also, the BOX layer 104 exists to isolate the fins 108 and epis at the edge of the device from the buried powered rail.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a semiconductor device, the method comprising:
    forming a buried oxide (BOX) layer;
    forming a plurality of channel fins on the BOX layer;
    forming a bottom epitaxial layer on the BOX layer and between the channel fins;
    forming a gate stack over the bottom epitaxial layer and contacting the channel fins, the gate stack including a work function metal (WFM) layer and a high-κ layer;
    forming a top epitaxial layer on the gate stack; and
    forming a buried power rail on the BOX layer, wherein the BOX layer is between the buried power rail and the bottom epitaxial layer, and
    wherein between two adjacent ones of the channel fins the BOX layer has an opening so that the bottom epitaxial layer is electrically connected to the buried power rail.

2. The method of claim 1, further comprising forming a third channel fin that is electrically isolated from the buried power rail by the BOX layer.

3. The method of claim 1, further comprising forming a bottom spacer layer between the bottom epitaxial layer and the gate stack, and forming a top spacer layer between the gate stack and the top epitaxial layer.

4. The method of claim 3, wherein the bottom spacer and the top spacer are formed of at least one dielectric material selected from the group consisting of $SiO_2$, SiN, silicon carbide oxide (SiCO), and silicon boron carbide nitride (SiBCN).

5. The method of claim 1, further comprising forming a silicide layer between the buried power rail and the bottom epitaxial layer.

6. The method of claim 1, further comprising forming shallow trench isolation (STI) regions in the first epitaxial layer.

7. The method of claim 6, wherein the STI regions are formed in such a manner as to create a two fin device that is separated from other fins.

8. The method of claim 1, wherein the high-K layer of the gate stack includes at least one material selected from the group consisting of hafnium oxide ($HfO_2$), hafnium silicon oxide (Hf-Si-O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate.

9. The method of claim 1, further comprising forming an interlayer dielectric layer between portions of the gate stack.

10. The method of claim 1, wherein a first portion of the bottom epitaxial layer corresponds to a pFET and a second portion of the bottom epitaxial layer corresponds to an nFET.

\*    \*    \*    \*    \*